United States Patent
Yang et al.

(10) Patent No.: US 9,910,749 B2
(45) Date of Patent: Mar. 6, 2018

(54) NON-VOLATILE MEMORY WITH DYNAMIC REPURPOSE OF WORD LINE

(71) Applicant: SANDISK TECHNOLOGIES LLC, Plano, TX (US)

(72) Inventors: Nian Niles Yang, Mountain View, CA (US); Jiahui Yuan, Fremont, CA (US); Grishma Shah, Milpitas, CA (US); Xinde Hu, San Diego, CA (US); Lanlan Gu, San Jose, CA (US); Bin Wu, Fremont, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/191,150

(22) Filed: Jun. 23, 2016

(65) Prior Publication Data
US 2017/0371755 A1 Dec. 28, 2017

(51) Int. Cl.
| G11C 16/04 | (2006.01) |
| G06F 11/20 | (2006.01) |
| G11C 16/08 | (2006.01) |
| G11C 16/10 | (2006.01) |
| G11C 16/16 | (2006.01) |

(52) U.S. Cl.
CPC ...... *G06F 11/2094* (2013.01); *G11C 16/0483* (2013.01); *G11C 16/08* (2013.01); *G11C 16/10* (2013.01); *G11C 16/16* (2013.01); *G06F 2201/805* (2013.01); *G06F 2201/82* (2013.01)

(58) Field of Classification Search
CPC ............. G06F 11/2094; G06F 2201/82; G06F 2201/805; G11C 16/0483; G11C 16/08; G11C 16/16; G11C 16/10
See application file for complete search history.

(56) References Cited

U.S. PATENT DOCUMENTS

| 5,465,233 A | 11/1995 | Slemmer |
| 5,765,185 A | 6/1998 | Lambrache |
| 5,835,413 A | 11/1998 | Hurter |
| 6,046,086 A | 4/2000 | Lin |
| 6,348,378 B1 * | 2/2002 | Lee ......................... H01L 21/84 257/321 |
| 7,518,920 B2 | 4/2009 | Kang |
| (Continued) |

OTHER PUBLICATIONS

Sabde, "Select Gate Defect Detection," U.S. Appl. No. 15/005,487, filed Jan. 25, 2016.

*Primary Examiner* — Khamdan Alrobaie
(74) *Attorney, Agent, or Firm* — Vierra Magen Marcus LLP

(57) ABSTRACT

A non-volatile memory system includes a plurality of non-volatile data memory cells arranged into groups of data memory cells, a plurality of select devices connected to the groups of data memory cells, a selection line connected to the select devices, a plurality of data word lines connected to the data memory cells, and one or more control circuits connected to the selection line and the data word lines. The one or more control circuits are configured to determine whether the select devices are corrupted. If the select devices are corrupted, then the one or more control circuits repurpose one of the word lines (e.g., the first data word line closet to the select devices) to be another selection line, thus operating the memory cells connected to the repurposed word line as select devices.

12 Claims, 17 Drawing Sheets

(56) References Cited

U.S. PATENT DOCUMENTS

| | | | |
|---|---|---|---|
| 7,606,071 B2 | 10/2009 | Sekar | |
| 8,861,282 B2 | 10/2014 | Dutta | |
| 8,902,657 B2 | 12/2014 | Iwai | |
| 9,105,349 B2 | 8/2015 | Avila | |
| 9,152,497 B2 | 10/2015 | Lee | |
| 9,343,164 B2 | 5/2016 | Tseng | |
| 2010/0118606 A1* | 5/2010 | Lee | G11C 11/5628 365/185.03 |
| 2011/0047322 A1 | 2/2011 | Allen | |
| 2014/0085982 A1* | 3/2014 | Asaoka | G11C 16/06 365/185.17 |
| 2015/0221385 A1* | 8/2015 | Ahn | G11C 16/10 365/185.2 |
| 2015/0262698 A1* | 9/2015 | Shirakawa | G11C 16/3445 365/185.11 |
| 2016/0141301 A1 | 5/2016 | Mokhlesi | |
| 2017/0169897 A1* | 6/2017 | Lee | G11C 16/3495 |

\* cited by examiner

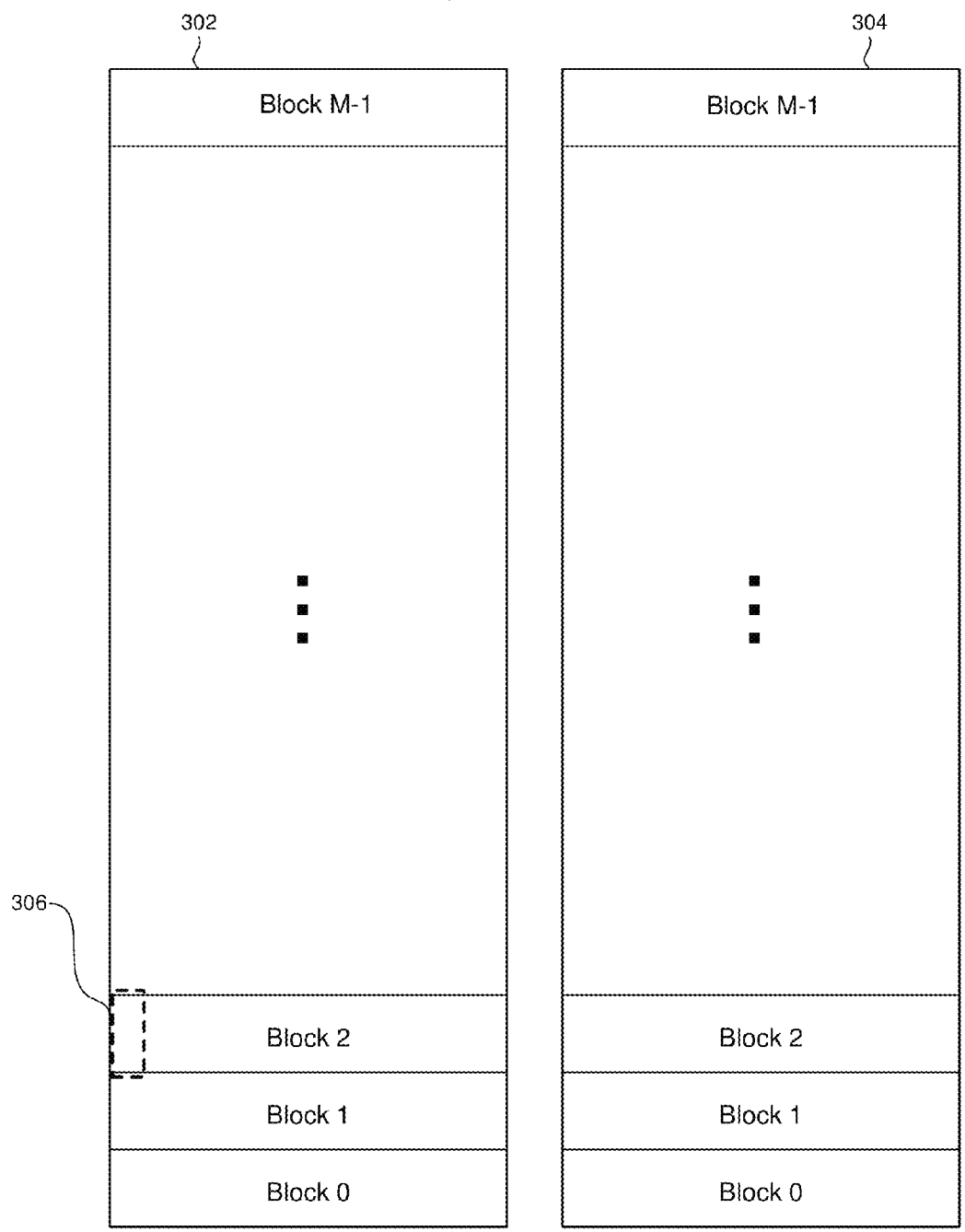

Figure 5
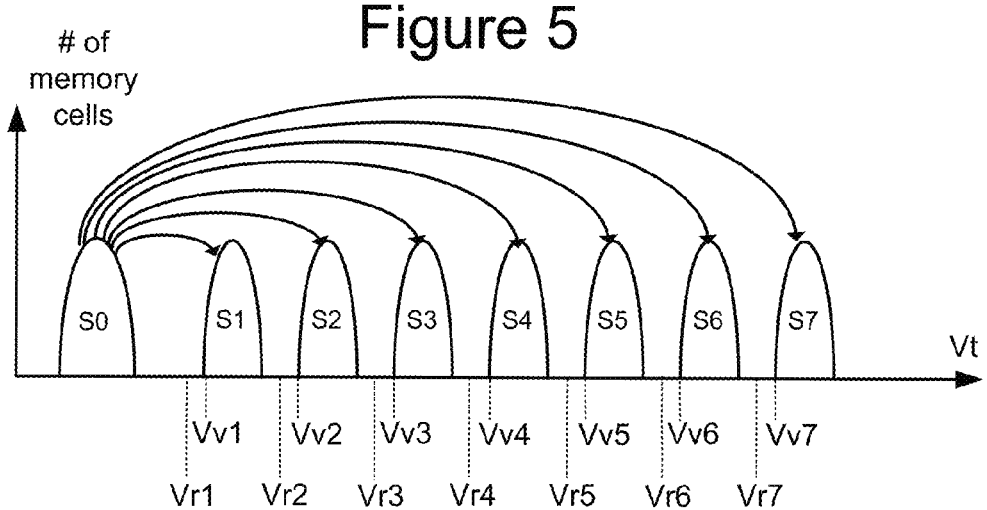
Figure 5A
|  | S0 | S1 | S2 | S3 | S4 | S5 | S6 | S7 |
|---|---|---|---|---|---|---|---|---|
| Upper Page | 1 | 1 | 1 | 0 | 0 | 0 | 0 | 1 |
| Middle Page | 1 | 1 | 0 | 0 | 1 | 1 | 0 | 0 |
| Lower Page | 1 | 0 | 0 | 0 | 0 | 1 | 1 | 1 |
Figure 5B
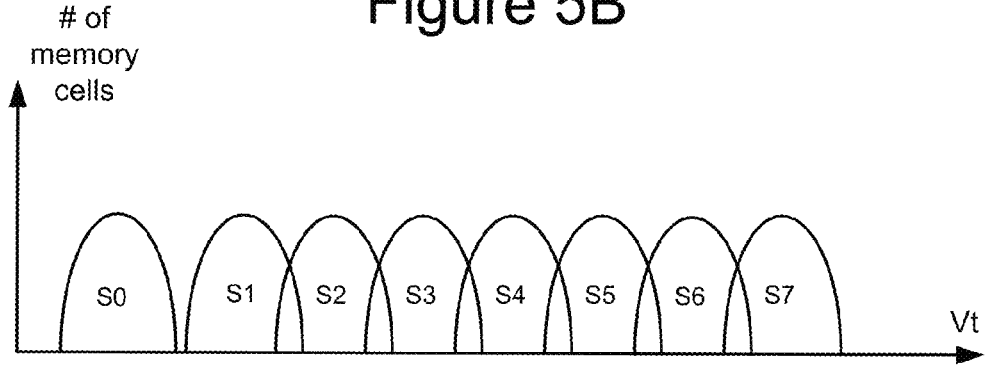

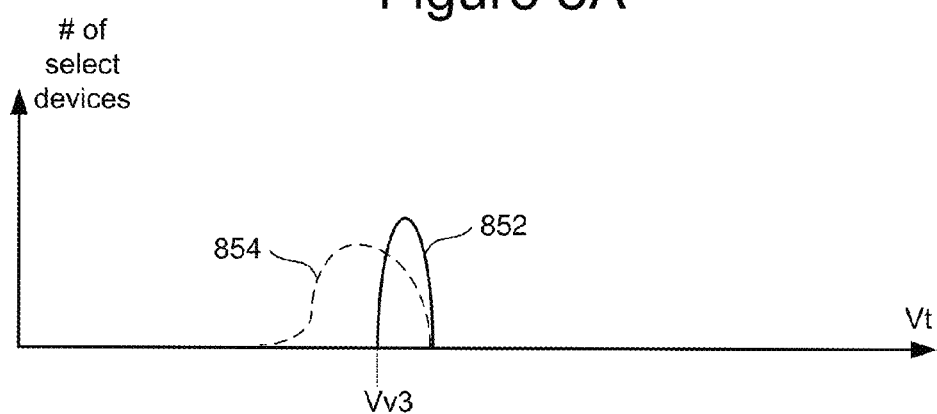
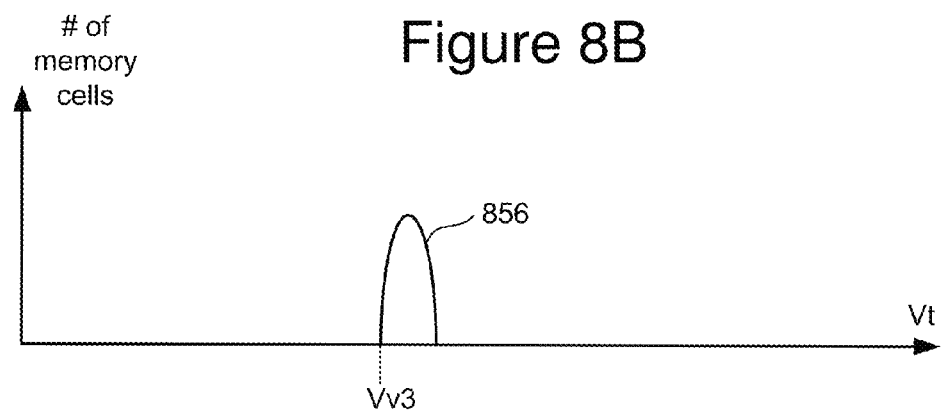

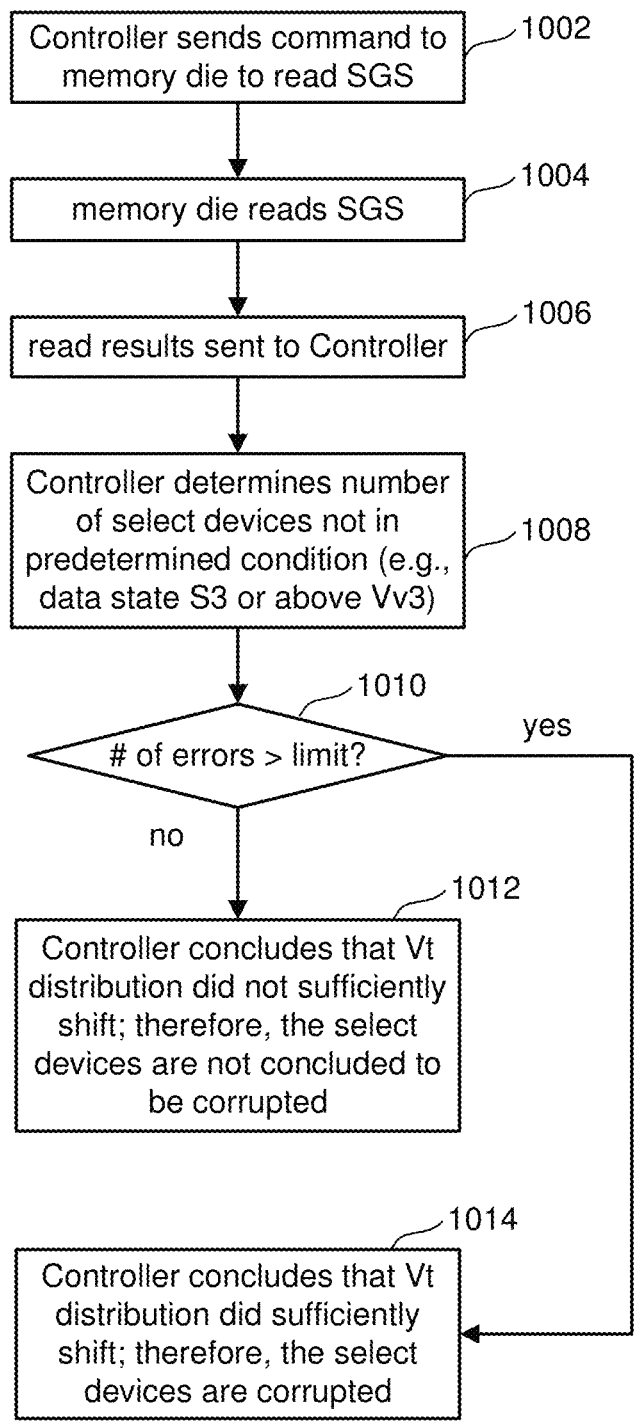

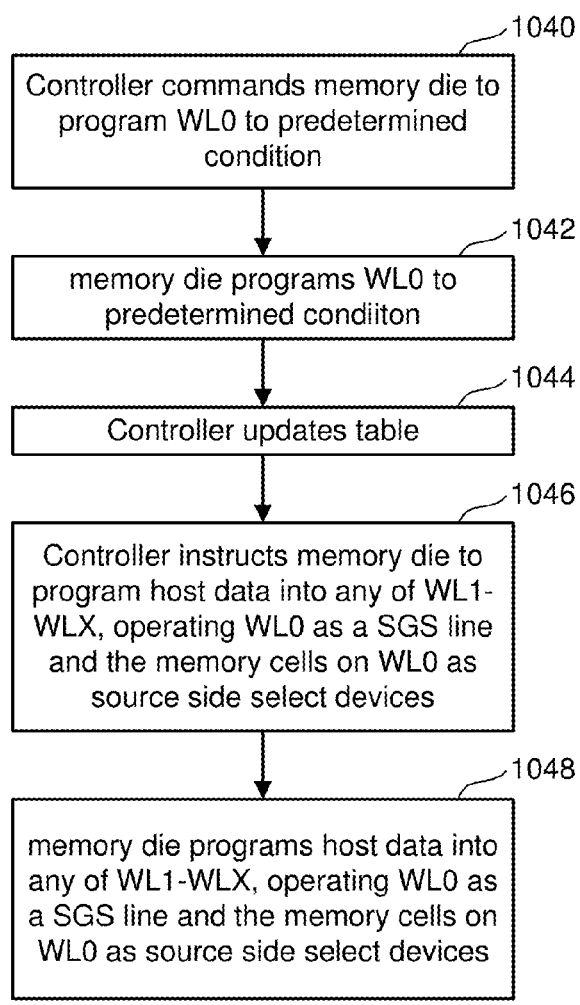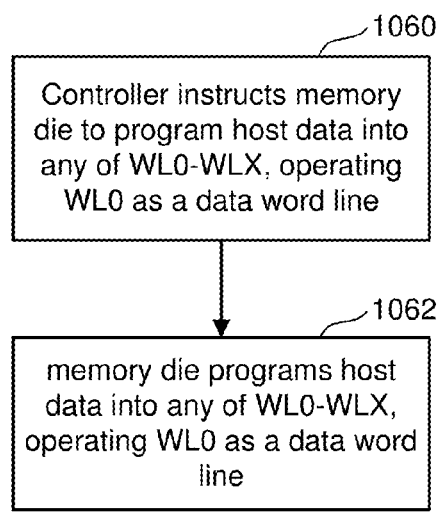

NON-VOLATILE MEMORY WITH DYNAMIC REPURPOSE OF WORD LINE

BACKGROUND

Semiconductor memory is widely used in various electronic devices such as cellular telephones, digital cameras, personal digital assistants, medical electronics, mobile computing devices, and non-mobile computing devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory), Electrically Erasable Programmable Read-Only Memory (EEPROM), and others.

A charge-trapping material can be used in non-volatile memory devices to store a charge which represents a data state. The charge-trapping material can be arranged vertically in a three-dimensional (3D) stacked memory structure. One example of a 3D memory structure is the Bit Cost Scalable (BiCS) architecture which comprises a stack of alternating conductive and dielectric layers. A memory hole is formed in the stack and a vertical NAND string is then formed by filling the memory hole with materials including a charge-trapping layer to create a vertical column of memory cells. Each memory cell can store one or more bits of data.

When a memory system is deployed in an electronic device, the memory system can be used to program data, read data and/or erase data. It is important that once data is stored in a memory system, the data is retained without uncorrectable errors.

BRIEF DESCRIPTION OF THE DRAWINGS

Like-numbered elements refer to common components in the different figures.

FIG. 4A is a block diagram of a memory structure having two planes.

FIG. 5 depicts threshold voltage distributions.

FIG. 5A is a table describing one example of an assignment of data values to data states.

FIG. 5B depicts threshold voltage distributions.

FIGS. 8A and 8B depict threshold voltage distributions.

FIG. 10A is a flow chart describing one embodiment of a process for determining whether select devices are corrupted.

FIG. 10B is a flow chart describing one embodiment of a process for operating memory cells as select devices FIG. 10C is a flow chart describing one embodiment of a process for operating memory cells to store host data.

DETAILED DESCRIPTION

A non-volatile memory system includes a plurality of non-volatile data memory cells arranged into groups of data memory cells, a plurality of select devices connected to the groups of data memory cells, a selection line connected to the select devices, a plurality of data word lines connected to the data memory cells, and one or more control circuits connected to the selection line and the data word lines. The one or more control circuits are configured to determine whether the select devices are corrupted. If the select devices are corrupted, then the one or more control circuits repurpose one of the word lines (e.g., the first data word line closet to the select devices) to be another selection line, thus operating the memory cells connected to the repurposed word line as select devices.

Figure 1:
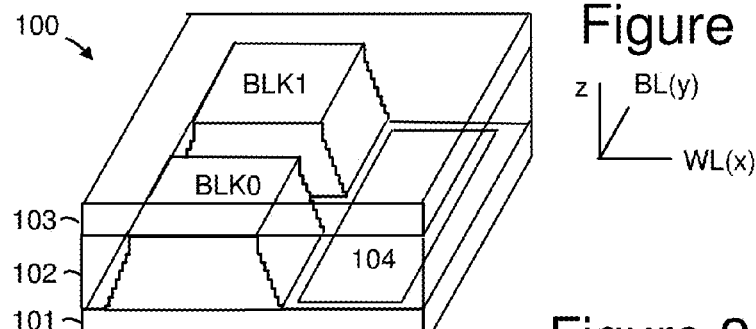
FIG. 1 is a perspective view of a 3D stacked non-volatile memory device.

FIGS. 1-4F describe one example of a memory system that can be used to implement the technology proposed herein. FIG. 1 is a perspective view of a three dimensional (3D) stacked non-volatile memory device. The memory device 100 includes a substrate 101. On and above the substrate are example blocks BLK0 and BLK1 of memory cells (non-volatile storage elements). Also on substrate 101 is peripheral area 104 with support circuits for use by the blocks. Substrate 101 can also carry circuits under the blocks, along with one or more lower metal layers which are patterned in conductive paths to carry signals of the circuits. The blocks are formed in an intermediate region 102 of the memory device. In an upper region 103 of the memory device, one or more upper metal layers are patterned in conductive paths to carry signals of the circuits. Each block comprises a stacked area of memory cells, where alternating levels of the stack represent word lines. While two blocks are depicted as an example, additional blocks can be used, extending in the x- and/or y-directions.

In one example implementation, the length of the plane in the x-direction, represents a direction in which signal paths for word lines extend (a word line or SGD line direction), and the width of the plane in the y-direction, represents a direction in which signal paths for bit lines extend (a bit line direction). The z-direction represents a height of the memory device.

Figure 2:
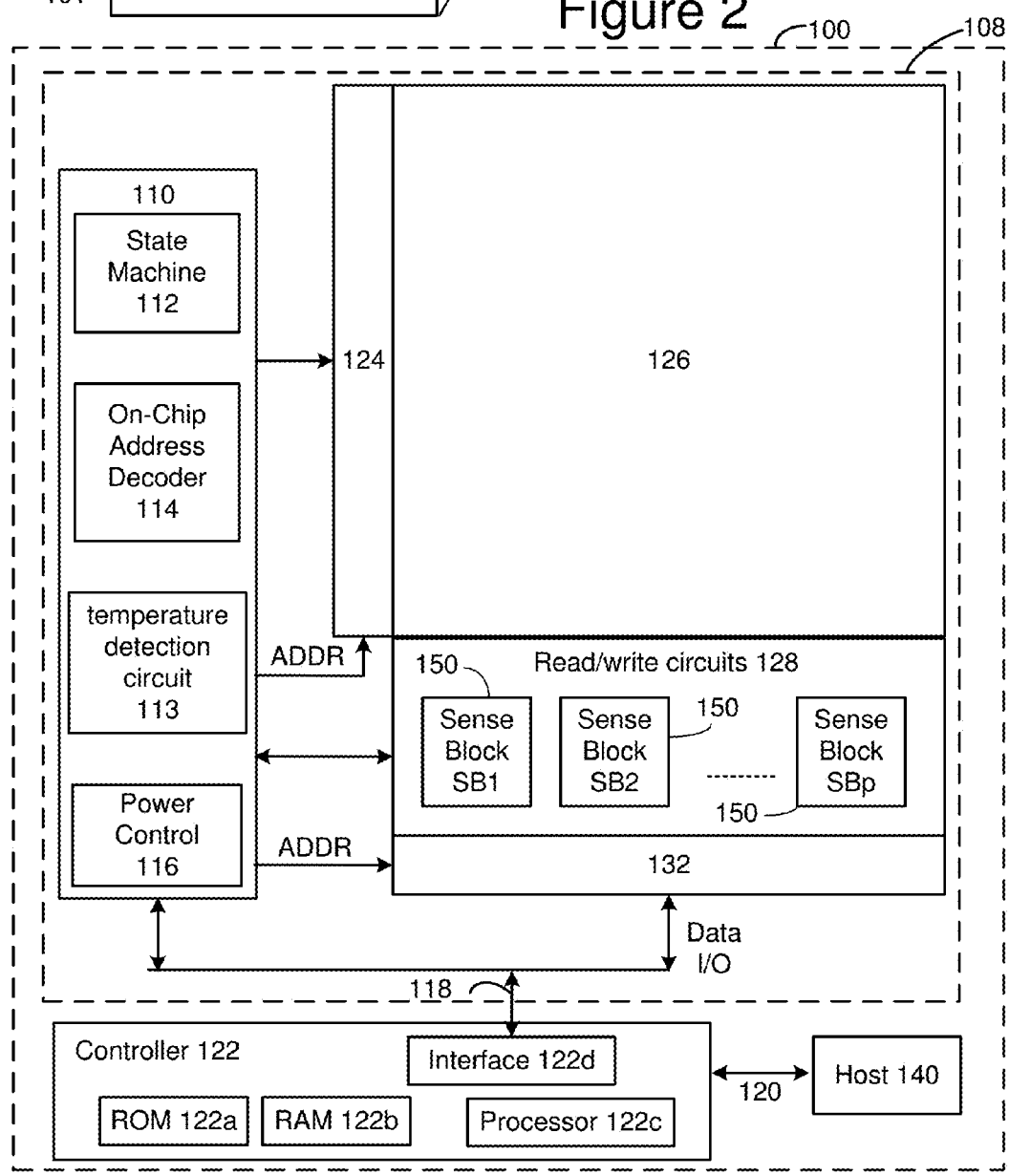
FIG. 2 is a functional block diagram of a memory device such as the 3D stacked non-volatile memory device 100 of FIG. 1.

FIG. 2 is a functional block diagram of an example memory device such as the 3D stacked non-volatile memory device 100 of FIG. 1. The components depicted in FIG. 2 are electrical circuits. Memory device 100 includes one or more memory die 108. Each memory die 108 includes a three dimensional memory structure 126 of memory cells (such as, for example, a 3D array of memory cells), control circuitry 110, and read/write circuits 128. In other embodiments, a two dimensional array of memory cells can be used. Memory structure 126 is addressable by word lines via a row decoder 124 and by bit lines via a column decoder 132. The read/write circuits 128 include multiple sense blocks 150 including SB1, SB2, . . . , SBp (sensing circuitry) and allow a page of memory cells to be read or programmed in parallel. In some systems, a Controller 122 is included in the same memory device 100 (e.g., a removable storage card) as the one or more memory die 108. However, in other systems, the Controller can be separated from the memory die 108. In some embodiments the Controller will be on a different die than the memory die. In some embodiments, one Controller 122 will communicate with multiple memory die 108. In other embodiments, each memory die 108 has its own Controller. Commands and data are transferred between the host 140 and Controller 122 via a data bus 120, and between Controller 122 and the one or more memory die 108 via lines 118. In one embodiment, memory die 108 includes a set of input and/or output (I/O) pins that connect to lines 118.

Memory structure 126 may comprise one or more arrays of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

Control circuitry 110 cooperates with the read/write circuits 128 to perform memory operations (e.g., erase, program, read, and others) on memory structure 126, and includes a state machine 112, an on-chip address decoder 114, and a power control module 116. The state machine 112 provides die-level control of memory operations. Temperature detection circuit 113 is configured to detect temperature, and can be any suitable temperature detection circuit known in the art. In one embodiment, state machine 112 is programmable by the software. In other embodiments, state machine 112 does not use software and is completely implemented in hardware (e.g., electrical circuits). In one embodiment, control circuitry 110 includes registers, ROM fuses and other storage devices for storing default values such as base voltages and other parameters.

The on-chip address decoder 114 provides an address interface between addresses used by host 140 or Controller 122 to the hardware address used by the decoders 124 and 132. Power control module 116 controls the power and voltages supplied to the word lines and bit lines during memory operations. It can include drivers for word line layers (discussed below) in a 3D configuration, select transistors (e.g., SGS and SGD transistors, described below) and source lines. Power control module 116 may include charge pumps for creating voltages. The sense blocks include bit line drivers. An SGS transistor is a select gate transistor at a source end of a NAND string, and an SGD transistor is a select gate transistor at a drain end of a NAND string.

Any one or any combination of control circuitry 110, state machine 112, decoders 114/124/132, temperature detection circuit 113, power control module 116, sense blocks 150, read/write circuits 128, and Controller 122 can be considered one or more control circuits (or a managing circuit) that performs the functions described herein.

The (on-chip or off-chip) Controller 122 (which in one embodiment is an electrical circuit) may comprise one or more processors 122c, ROM 122a, RAM 122b and a Memory Interface 122d, all of which are interconnected. One or more processors 122C is one example of a control circuit. Other embodiments can use state machines or other custom circuits designed to perform one or more functions. The storage devices (ROM 122a, RAM 122b) comprises code such as a set of instructions, and the processor 122c is operable to execute the set of instructions to provide the functionality described herein. Alternatively or additionally, processor 122c can access code from a storage device in the memory structure, such as a reserved area of memory cells connected to one or more word lines. Memory interface 122d, in communication with ROM 122a, RAM 122b and processor 122c, is an electrical circuit that provides an electrical interface between Controller 122 and memory die 108. For example, memory interface 122d can change the format or timing of signals, provide a buffer, isolate from surges, latch I/O, etc. Processor 122C can issue commands to control circuitry 110 (or any other component of memory die 108) via Memory Interface 122d.

Multiple memory elements in memory structure 126 may be configured so that they are connected in series or so that each element is individually accessible. By way of non-limiting example, flash memory devices in a NAND configuration (NAND flash memory) typically contain memory elements connected in series. A NAND string is an example of a set of series-connected memory cells and select gate transistors.

A NAND flash memory array may be configured so that the array is composed of multiple NAND strings of which a NAND string is composed of multiple memory cells sharing a single bit line and accessed as a group. Alternatively, memory elements may be configured so that each element is individually accessible, e.g., a NOR memory array. NAND and NOR memory configurations are exemplary, and memory cells may be otherwise configured.

The memory cells may be arranged in the single memory device level in an ordered array, such as in a plurality of rows and/or columns. However, the memory elements may be arrayed in non-regular or non-orthogonal configurations, or in structures not considered arrays.

A three dimensional memory array is arranged so that memory cells occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory cells. The vertical columns may be arranged in a two dimensional configuration, e.g., in an x-y plane, resulting in a three dimensional arrangement of memory cells, with memory cells on multiple vertically stacked memory planes. Other configurations of memory elements in three dimensions can also constitute a three dimensional memory array.

By way of non-limiting example, in a three dimensional NAND memory array, the memory elements may be coupled together to form vertical NAND strings that traverse across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

A person of ordinary skill in the art will recognize that the technology described herein is not limited to a single specific memory structure, but covers many relevant memory structures within the spirit and scope of the technology as described herein and as understood by one of ordinary skill in the art.

Figure 3:
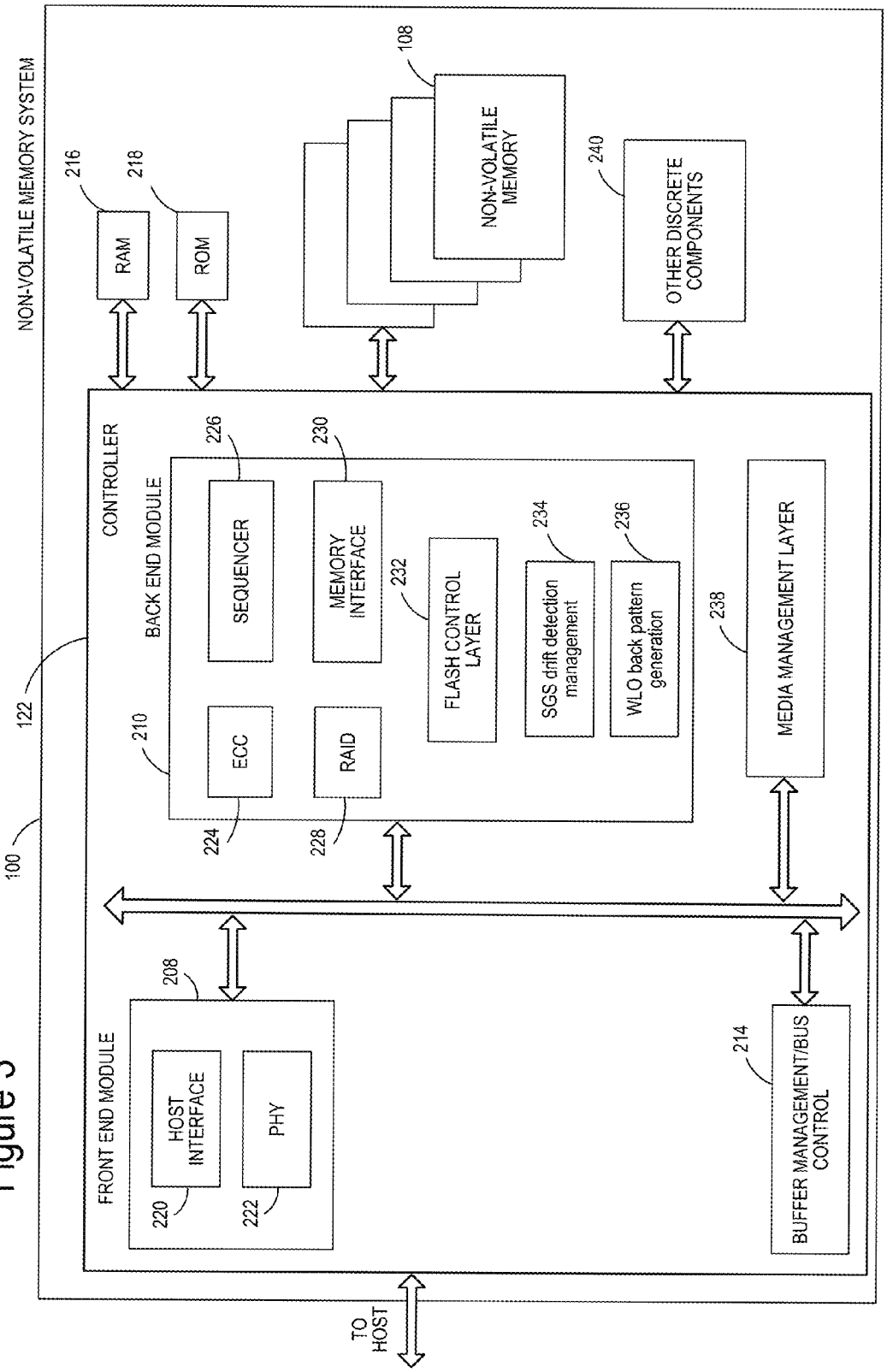
FIG. 3 is a block diagram depicting one embodiment of a Controller.

FIG. 3 is a block diagram of example memory system 100, depicting more details of Controller 122. As used herein, a flash memory Controller is a device that manages data stored on flash memory and communicates with a host, such as a computer or electronic device. A flash memory Controller can have various functionality in addition to the specific functionality described herein. For example, the flash memory Controller can format the flash memory to ensure the memory is operating properly, map out bad flash memory cells, and allocate spare memory cells to be substituted for future failed cells. Some part of the spare cells can be used to hold firmware to operate the flash memory Controller and implement other features. In operation, when a host needs to read data from or write data to the flash memory, it will communicate with the flash memory Controller. If the host provides a logical address to which data is to be read/written, the flash memory Controller can convert the logical address received from the host to a physical address in the flash memory. (Alternatively, the host can provide the physical address). The flash memory Controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between Controller 122 and non-volatile memory die 108 may be any suitable flash interface, such as Toggle Mode 200, 400, or 800. In one embodiment, memory system 100 may be a card based system, such as a secure digital (SD) or a micro secure digital (micro-SD) card. In an alternate embodiment, memory system 100 may be part of an embedded memory system. For example, the flash memory may be embedded within the host, such as in the form of a solid state disk (SSD) drive installed in a personal computer.

In some embodiments, non-volatile memory system 100 includes a single channel between Controller 122 and non-volatile memory die 108, the subject matter described herein is not limited to having a single memory channel For example, in some memory system architectures, 2, 4, 8 or more channels may exist between the Controller and the memory die, depending on Controller capabilities. In any of the embodiments described herein, more than a single channel may exist between the Controller and the memory die, even if a single channel is shown in the drawings.

As depicted in FIG. 3, Controller 112 includes a front end module 208 that interfaces with a host, a back end module 210 that interfaces with the one or more non-volatile memory die 108, and various other modules that perform functions which will now be described in detail.

The components of Controller 122 depicted in FIG. 3 may take the form of a packaged functional hardware unit (e.g., an electrical circuit) designed for use with other components, a portion of a program code (e.g., software or firmware) executable by a (micro)processor or processing circuitry that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include software stored in a processor readable device (e.g., memory) to program a processor for Controller 122 to perform the functions described herein. The architecture depicted in FIG. 3 is one example implementation that may (or may not) use the components of Controller 122 depicted in FIG. 2 (i.e. RAM, ROM, processor, interface).

Referring again to modules of the Controller 122, a buffer manager/bus control 214 manages buffers in random access memory (RAM) 216 and controls the internal bus arbitration of Controller 122. A read only memory (ROM) 218 stores system boot code. Although illustrated in FIG. 3 as located separately from the Controller 122, in other embodiments one or both of the RAM 216 and ROM 218 may be located within the Controller. In yet other embodiments, portions of RAM and ROM may be located both within the Controller 122 and outside the Controller. Further, in some implementations, the Controller 122, RAM 216, and ROM 218 may be located on separate semiconductor die.

Front end module 208 includes a host interface 220 and a physical layer interface (PHY) 222 that provide the electrical interface with the host or next level storage Controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction Controller (ECC) engine 224 that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as an extra die or dies as implied by the common name, but it may also be added within the existing die, e.g. as an extra plane, or extra block, or extra WLs within a block. A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or 800 interface. A flash control layer 232 controls the overall operation of back end module 210. A SGS drift detection management module 234 is used to perform/manage the process for repurposing a word line to be another selection line, thus operating the memory cells connected to the repurposed word line as select devices. A WL back pattern generation module 236 is used to generate a data pattern to be written to memory cells connected to a word line that is being re-purposed as a selection line.

Additional components of system 100 illustrated in FIG. 3 include media management layer 238, which performs wear leveling of memory cells of non-volatile memory die 108. System 100 also includes other discrete components 240, such as external electrical interfaces, external RAM, resistors, capacitors, or other components that may interface with Controller 122. In alternative embodiments, one or more of the physical layer interface 222, RAID module 228, media management layer 238 and buffer management/bus Controller 214 are optional components that are not necessary in the Controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the flash memory 126 of die 108. The MML 238 may be needed because: 1) the flash memory may have limited endurance; 2) the flash memory 126 may only be written in multiples of pages; and/or 3) the flash memory 126 may not be written unless it is erased as a block. The MML 238 understands these potential limitations of the flash memory 126 which may not be visible to the host. Accordingly, the MML 238 attempts to translate the writes from host into writes into the flash memory 126. As described below, erratic bits may be identified and recorded using the MML 238. This recording of erratic bits can be used for evaluating the health of blocks and/or word lines (the memory cells on the word lines).

Controller 122 may interface with one or more memory dies 108. In one embodiment, Controller 122 and multiple memory dies (together comprising non-volatile storage system 100) implement a solid state drive (SSD), which can emulate, replace or be used instead of a hard disk drive inside a host, as a NAS device, etc. Additionally, the SSD need not be made to work as a hard drive.

In one embodiment, as discussed below with respect to FIGS. 7-12B, Controller 122 determines candidate bad blocks to test for usability based on previously recorded error codes, causes testing of the candidate bad blocks for usability, and causes storage of information in candidate blocks determined to be still usable.

Figure 4:
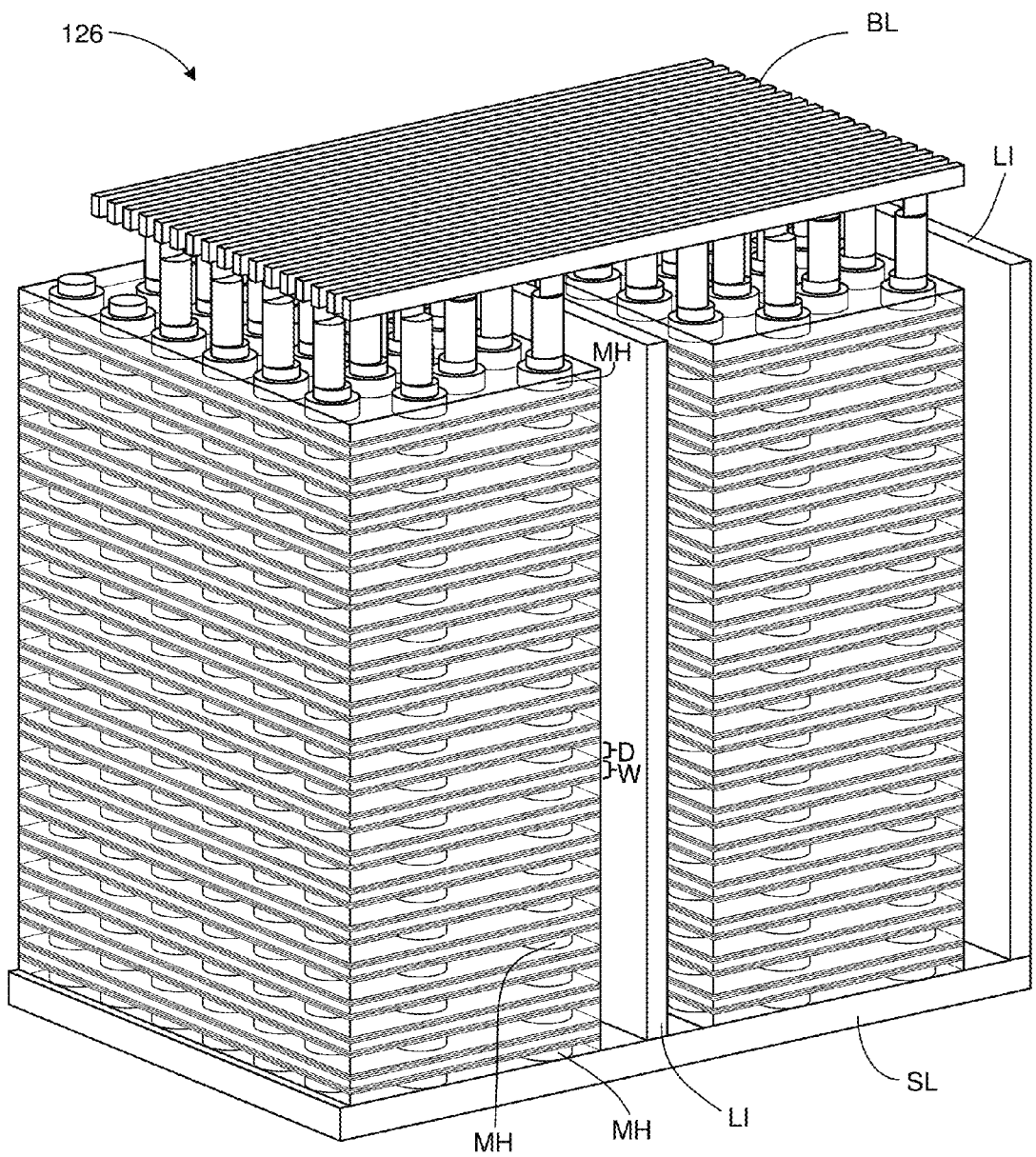
FIG. 4 is a perspective view of a portion of one embodiment of a three dimensional monolithic memory structure.

FIG. 4 is a perspective view of a portion of a monolithic three dimensional memory structure 126, which includes a plurality memory cells. For example, FIG. 4 shows a portion of one block of memory. The structure depicted includes a set of bit lines BL positioned above a stack of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-216 alternating dielectric layers and conductive layers, for example, 96 data word line layers, 8 select layers, 4 dummy word line layers and 108 dielectric layers. More or less than 108-216 layers can also be used. As will be explained below, the alternating dielectric layers and conductive layers are divided into four "fingers" by local interconnects LI. FIG. 4 only shows two fingers and two local interconnects LI. Below and the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping layer to create a vertical column of memory cells. Each memory cell can store one or more bits of data. More details of the three dimensional monolithic memory structure 126 is provided below with respect to FIG. 4A-4F.

FIG. 4A is a block diagram explaining one example organization of memory structure 126, which is divided into two planes 302 and 304. Each plane is then divided into M blocks. In one example, each plane has about 2000 blocks. However, different numbers of blocks and planes can also be used. In one embodiment, for two plane memory, the block IDs are usually such that even blocks belong to one plane and odd blocks belong to another plane; therefore, plane 302 includes block 0, 2, 4, 6, . . . and plane 304 includes blocks 1, 3, 5, 7, . . . . In on embodiment, a block of memory cells is a unit of erase. That is, all memory cells of a block are erased together. In other embodiments, memory cells can be grouped into blocks for other reasons, such as to organize the memory structure 126 to enable the signaling and selection circuits.

Figure 4B:
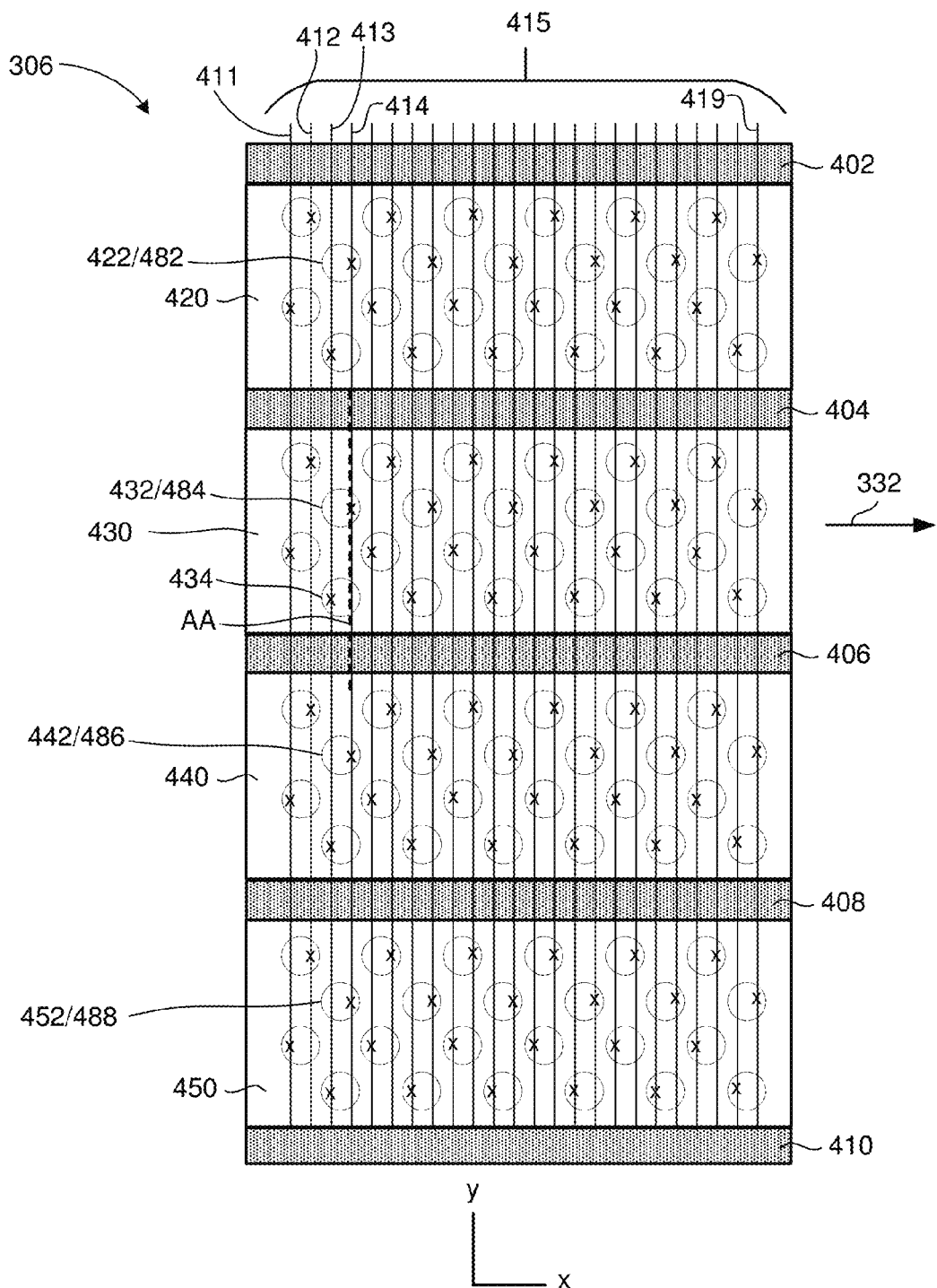
FIG. 4B depicts a top view of a portion of a block of memory cells.

FIGS. 4B-4F depict an example 3D NAND structure. FIG. 4B is a block diagram depicting a top view of a portion of one block from memory structure 126. The portion of the block depicted in FIG. 4B corresponds to portion 306 in block 2 of FIG. 4A. As can be seen from FIG. 4B, the block depicted in FIG. 4B extends in the direction of 332. In one embodiment, the memory array will have 60 layers. Other embodiments have less than or more than 60 layers. However, FIG. 4B only shows the top layer.

FIG. 4B depicts a plurality of circles that represent the vertical columns. Each of the vertical columns include multiple select transistors and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 330 and in the direction of arrow 332, the block includes more vertical columns than depicted in FIG. 4B FIG. 4B also depicts a set of bit lines 415, including bit lines 411, 412, 413, 414, . . . 419. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 414 is connected to vertical columns 422, 432, 442 and 452.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as word line fingers that are separated by the local interconnects. In one embodiment, the word line fingers on a common level of a block connect together at the end of the block to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side selection lines and the drain side selection lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4B also shows the vertical columns being staggered. In other embodiments, different patterns of staggering can be used. In some embodiments, the vertical columns are not staggered.

Figure 4C:
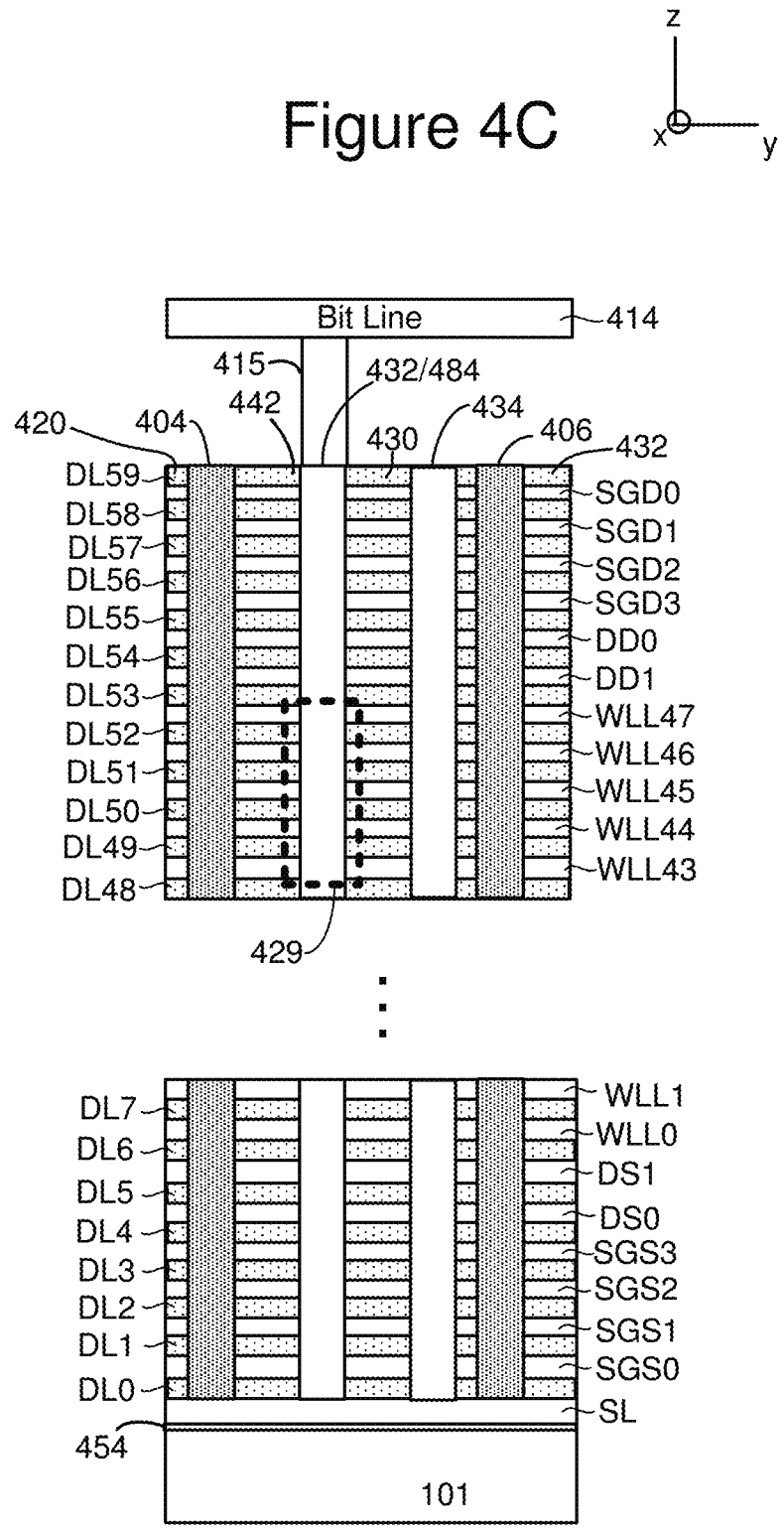
FIG. 4C depicts a cross sectional view of a portion of a block of memory cells.

FIG. 4C depicts a portion of an embodiment of three dimensional memory structure 126 showing a cross-sectional view along line AA of FIG. 4B. This cross sectional view cuts through vertical columns 432 and 434 and region 430 (see FIG. 4B). The structure of FIG. 4C includes four drain side select layers SGD0, SGD1, SGD2 and SGD3; four source side select layers SGS0, SGS1, SGS2 and SGS3; four dummy word line layers DD0, DD1, DS0 and DS1; and forty eight data word line layers WLL0-WLL47 for connecting to data memory cells. Other embodiments can implement more or less than four drain side select layers, more or less than four source side select layers, more or less than four dummy word line layers, and more or less than forty eight word line layers (e.g., 96 word line layers). Vertical columns 432 and 434 are depicted protruding through the drain side select layers, source side select layers, dummy word line layers and word line layers. In one embodiment, each vertical column comprises a NAND string. For example, vertical column 432 comprises NAND string 484. Below the vertical columns and the layers listed below is substrate 101, an insulating film 454 on the substrate, and source line SL. The NAND string of vertical column 432 has a source end at a bottom of the stack and a drain end at a top of the stack. As in agreement with FIG. 4B, FIG. 4C show vertical column 432 connected to Bit Line 414 via connector 415. Local interconnects 404 and 406 are also depicted.

For ease of reference, drain side select layers SGD0, SGD1, SGD2 and SGD3; source side select layers SGS0, SGS1, SGS2 and SGS3; dummy word line layers DD0, DD1, DS0 and DS1; and word line layers WLL0-WLL47 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL59. For example, dielectric layers DL49 is above word line layer WLL43 and below word line layer WLL44. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layer WLL0-WLL47 connect to memory cells (also called data memory cells). Dummy word line layers DD0, DD1, DS0 and DS1 connect to dummy memory cells. A dummy memory cell does not store host data (data provided from the host, such as data from a user of the host), while a data memory cell is eligible to store host data. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

Figure 4D:
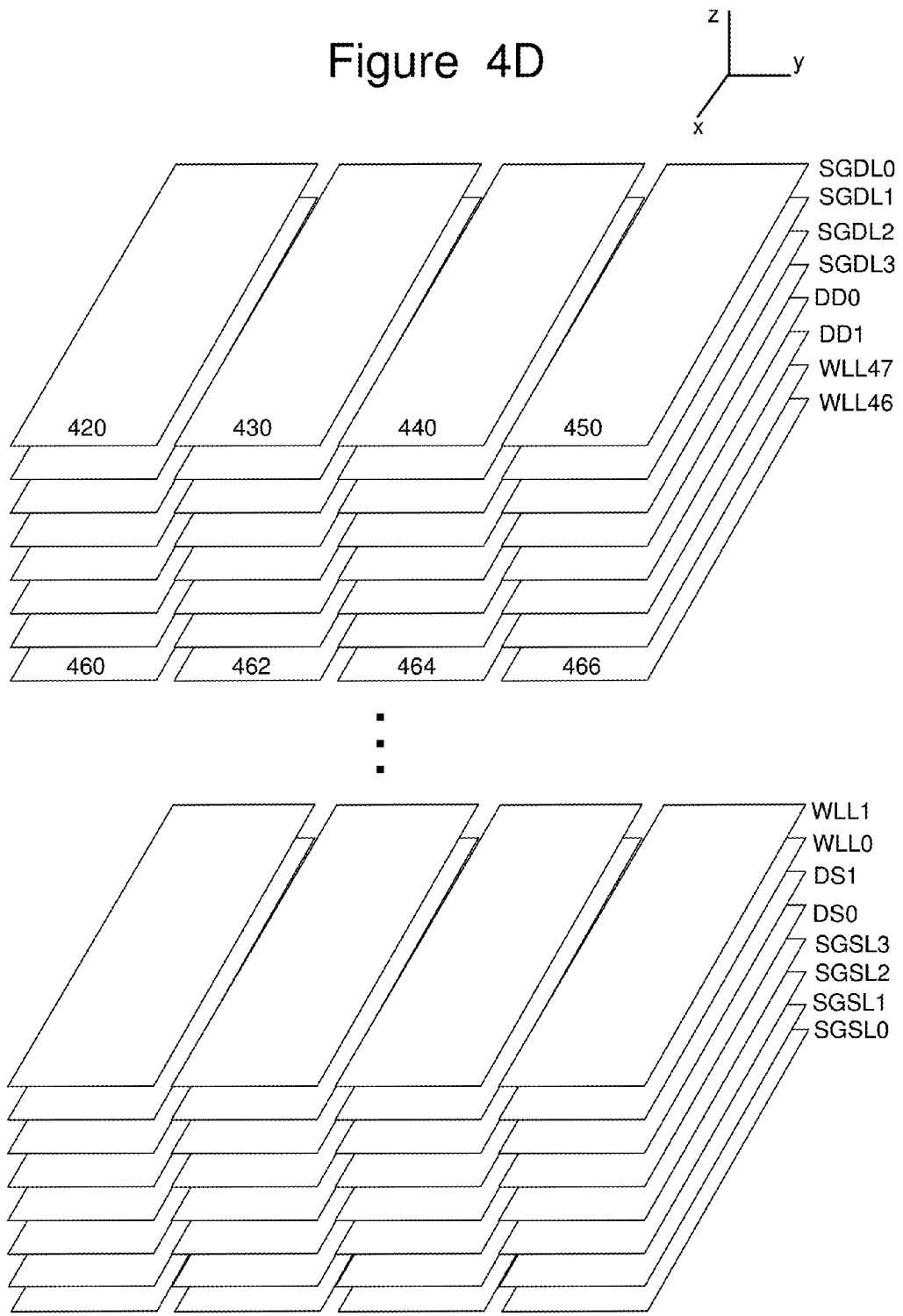
FIG. 4D depicts a view of the select gate layers and word line layers.

FIG. 4D depicts a logical representation of the conductive layers (SGD0, SGD1, SGD2, SGD3, SGS0, SGS1, SGS2, SGS3, DD0, DD1, DS0, DS1, and WLL0-WLL47) for the block that is partially depicted in FIG. 4C. As mentioned above with respect to FIG. 4B, in one embodiment local interconnects 402, 404, 406, 408 and 410 break up each conductive layers into four regions or fingers. For example, word line layer WLL31 is divided into regions 460, 462, 464 and 466. For word line layers (WLL0-WLL31), the regions are referred to as word line fingers; for example, word line layer WLL46 is divided into word line fingers 460, 462, 464 and 466. In one embodiment, the four word line fingers on a same level are connected together. In another embodiment, each word line finger operates as a separate word line.

Drain side select gate layer SGD0 (the top layer) is also divided into regions 420, 430, 440 and 450, also known as fingers or select line fingers. In one embodiment, the four select line fingers on a same level are connected together. In another embodiment, each select line finger operates as a separate word line.

Figure 4E:
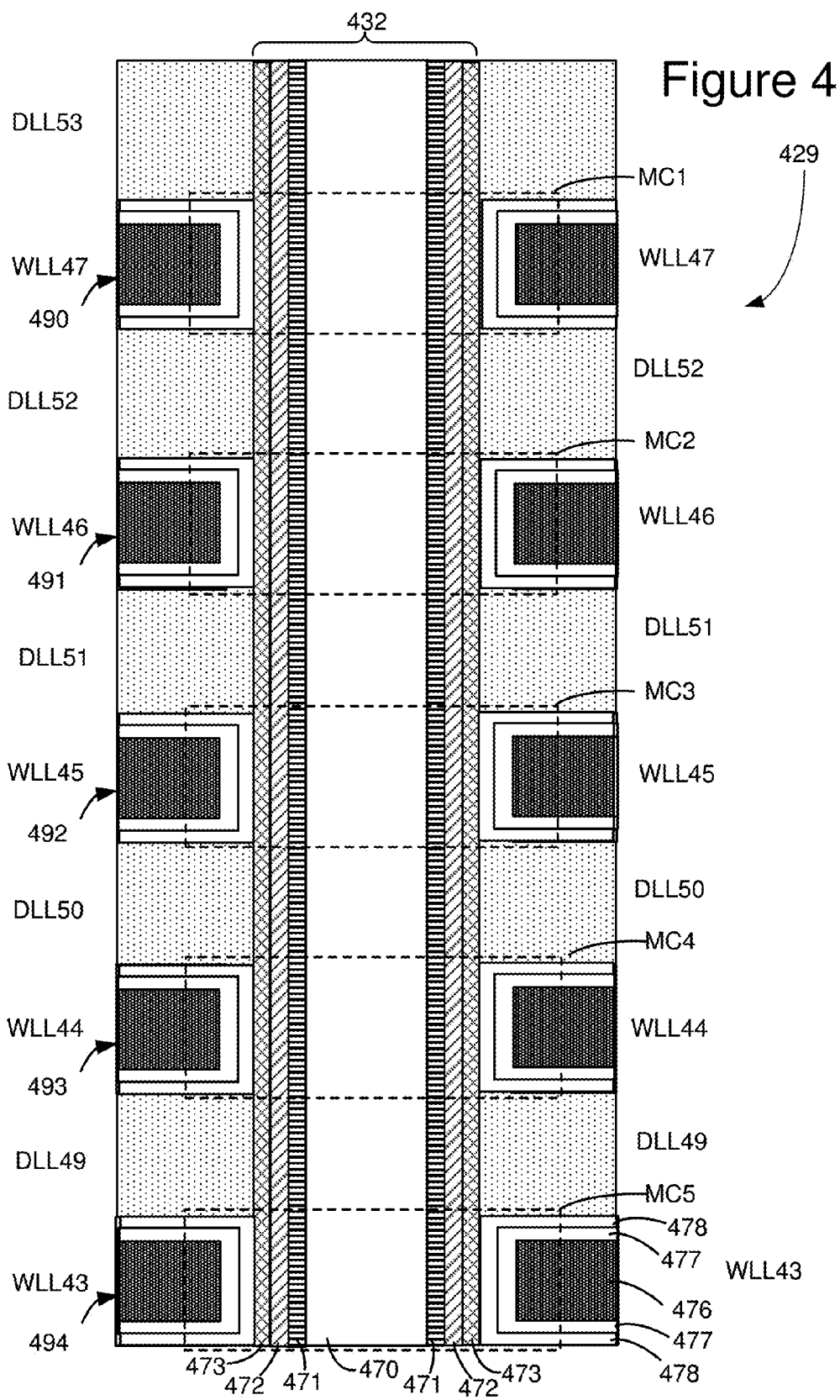
FIG. 4E is a cross sectional view of a vertical column of memory cells.

FIG. 4E depicts a cross sectional view of region 429 of FIG. 4C that includes a portion of vertical column 432. In one embodiment, the vertical columns are round and include four layers; however, in other embodiments more or less than four layers can be included and other shapes can be used. In one embodiment, vertical column 432 includes an inner core layer 470 that is made of a dielectric, such as $SiO_2$. Other materials can also be used. Surrounding inner core 470 is polysilicon channel 471. Materials other than polysilicon can also be used. Note that it is the channel 471 that connects to the bit line. Surrounding channel 471 is a tunneling dielectric 472. In one embodiment, tunneling dielectric 472 has an ONO structure. Surrounding tunneling dielectric 472 is charge trapping layer 473, such as (for example) Silicon Nitride. Other memory materials and structures can also be used. The technology described herein is not limited to any particular material or structure.

FIG. 4E depicts dielectric layers DLL49, DLL50, DLL51, DLL52 and DLL53, as well as word line layers WLL43, WLL44, WLL45, WLL46, and WLL47. Each of the word line layers includes a word line region 476 surrounded by an aluminum oxide layer 477, which is surrounded by a blocking oxide ($SiO_2$) layer 478. The physical interaction of the word line layers with the vertical column forms the memory cells. Thus, a memory cell, in one embodiment, comprises channel 471, tunneling dielectric 472, charge trapping layer 473, blocking oxide layer 478, aluminum oxide layer 477 and word line region 476. For example, word line layer WLL47 and a portion of vertical column 432 comprise a memory cell MC1. Word line layer WLL46 and a portion of vertical column 432 comprise a memory cell MC2. Word line layer WLL45 and a portion of vertical column 432 comprise a memory cell MC3. Word line layer WLL44 and a portion of vertical column 432 comprise a memory cell MC4. Word line layer WLL43 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Figure 4F:
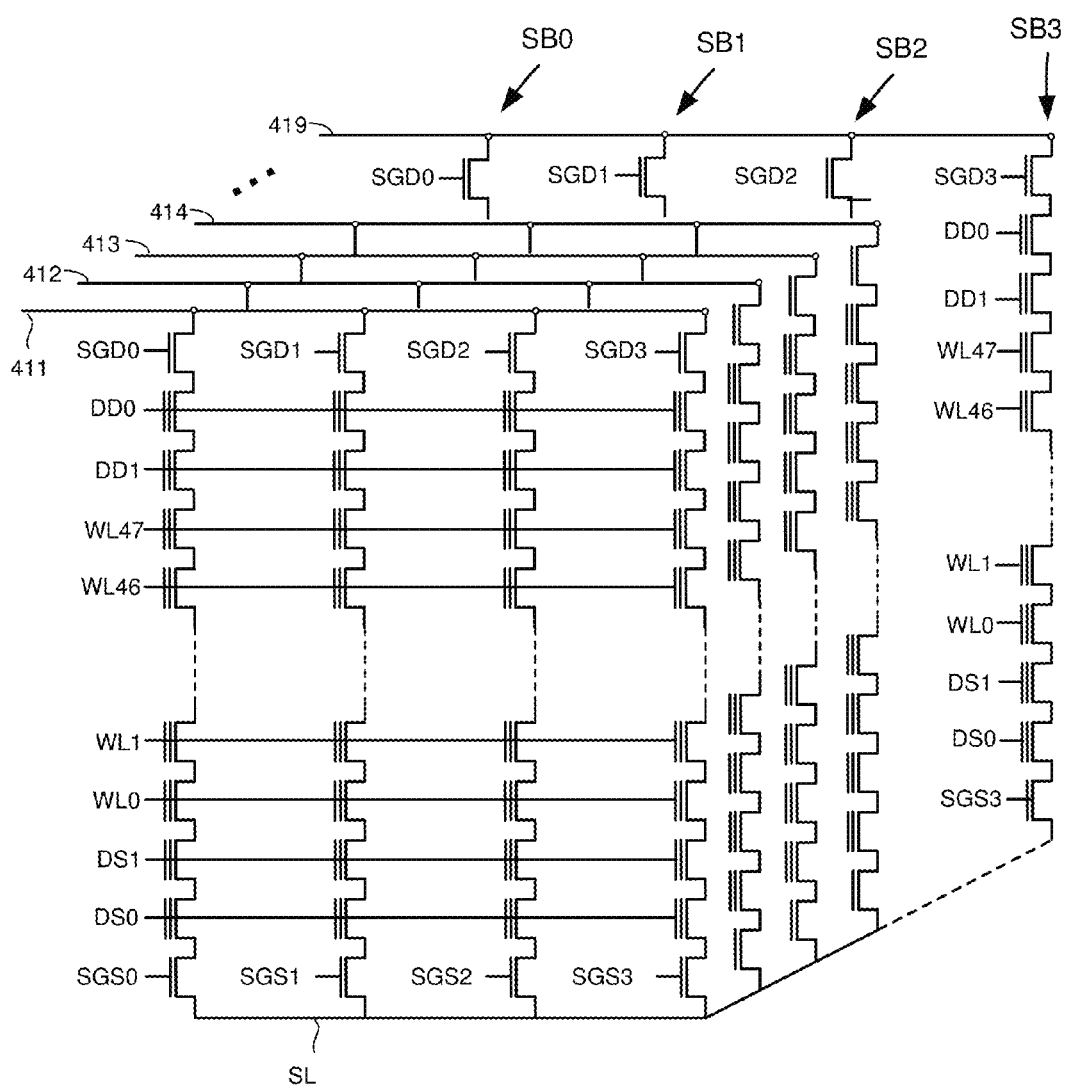
FIG. 4F is a schematic of a plurality of NAND strings.

FIG. 4F shows physical word lines WLL0-WLL47 running across the entire block. The structure of FIG. 4G corresponds to portion 306 in Block 2 of FIGS. 4A-F, including bit lines 411, 412, 413, 414, . . . 419. Within the block, each bit line connected to four NAND strings. Drain side selection lines SGD0, SGD1, SGD2 and SGD3 are used to determine which of the four NAND strings connect to the associated bit line. The block can also be thought of as divided into four sub-blocks SB0, SB1, SB2 and SB3. Sub-block SB0 corresponds to those vertical NAND strings controlled by SGD0 and SGS0, sub-block SB1 corresponds to those vertical NAND strings controlled by SGD1 and SGS1, sub-block SB2 corresponds to those vertical NAND strings controlled by SGD2 and SGS2, and sub-block SB3 corresponds to those vertical NAND strings controlled by SGD3 and SGS3.

Although the example memory system of FIGS. 4-4F is a three dimensional memory structure that includes vertical NAND strings with charge-trapping material, other (2D and 3D) memory structures can also be used with the technology described herein. For example, floating gate memories (e.g., NAND-type and NOR-type flash memory ReRAM memories, magnetoresistive memory (e.g., MRAM), and phase change memory (e.g., PCRAM) can also be used.

One example of a ReRAM memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. This configuration is known as a spin valve and is the simplest structure for an MRAM bit. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCRAM) exploits the unique behavior of chalcogenide glass. One embodiment uses a GeTe-Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

At the end of a successful programming process (with verification), the threshold voltages of the memory cells should be within one or more distributions of threshold voltages for programmed memory cells or within a distribution of threshold voltages for erased memory cells, as appropriate. FIG. 5 illustrates example threshold voltage distributions for the memory cell array when each memory cell stores three bits of data. Other embodiments, however, may use other data capacities per memory cell (e.g., such as one, two, four, or five bits of data per memory cell). FIG. 5 shows eight threshold voltage distributions, corresponding to eight data states. The first threshold voltage distribution (data state) S0 represents memory cells that are erased. The other seven threshold voltage distributions (data states) S1-S17 represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected.

FIG. 5 also shows seven read reference voltages, Vr1, Vr2, Vr3, Vr4, Vr5, Vr6, and Vr7, for reading data from memory cells. By testing whether the threshold voltage of a given memory cell is above or below the seven read reference voltages, the system can determine what data state (i.e., S0, S1, S2, S3, . . . ) the memory cell is in.

FIG. 5 also shows seven verify reference voltages, Vv1, Vv2, Vv3, Vv4, Vv5, Vv6, and Vv7. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv4. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 5 represent the full sequence programming The technology described herein can also be used with other types of programming in addition to full sequence programming (including, but not limited to, multiple stage/phase programming). In some embodiments, data states S1-D7 can overlap, with Controller 122 relying on ECC to identify the correct data being stored.

FIG. 5A is a table describing one example of an assignment of data values to data states. In the table of FIG. 5A, S0=111. S1=110, S2=200, S3=000, S4=010, S5=011, S6=001 and S7=101. Other encodings of data can also be used. No particular data encoding is required by the technology disclosed herein.

Figure 6A:
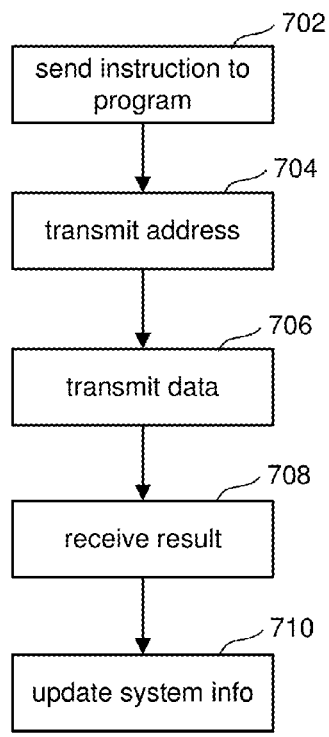
FIG. 6A is a flow chart describing one embodiment of a process for programming.

FIG. 6A is a flowchart describing one embodiment of a process for programming that is performed by Controller 122. In some embodiments, rather than have a dedicated Controller, the host can perform the functions of the Controller. In step 702, Controller 122 sends instructions to one or more memory die 108 to program data. In step 704, Controller 122 sends one or more logical addresses to one or more memory die 108. The one or more logical addresses indicate where to program the data. In step 706, Controller 122 sends the data to be programmed to the one or more memory die 108. In step 708, Controller 122 receives a result of the programming from the one or more memory die 108. Example results include that the data was programmed successfully, an indication that the programming operation failed, and indication that the data was programmed but at a different location, or other result. In step 710, in response to the result received in step 708, Controller 122 updates the system information that it maintains. In one embodiment, the system maintains tables of data that indicate status information for each block. This information may include a mapping of logical addresses to physical addresses, which blocks/word lines are open/closed (or partially opened/ closed), which blocks/word lines are bad, etc.

In some embodiments, before step 702, Controller 122 would receive host data and an instruction to program from the host, and the Controller would run the ECC engine to create code words from the host data. These code words are the data transmitted in step 706. Controller can also scramble the data to achieve wear leveling with respect to the memory cells.

Figure 6B:
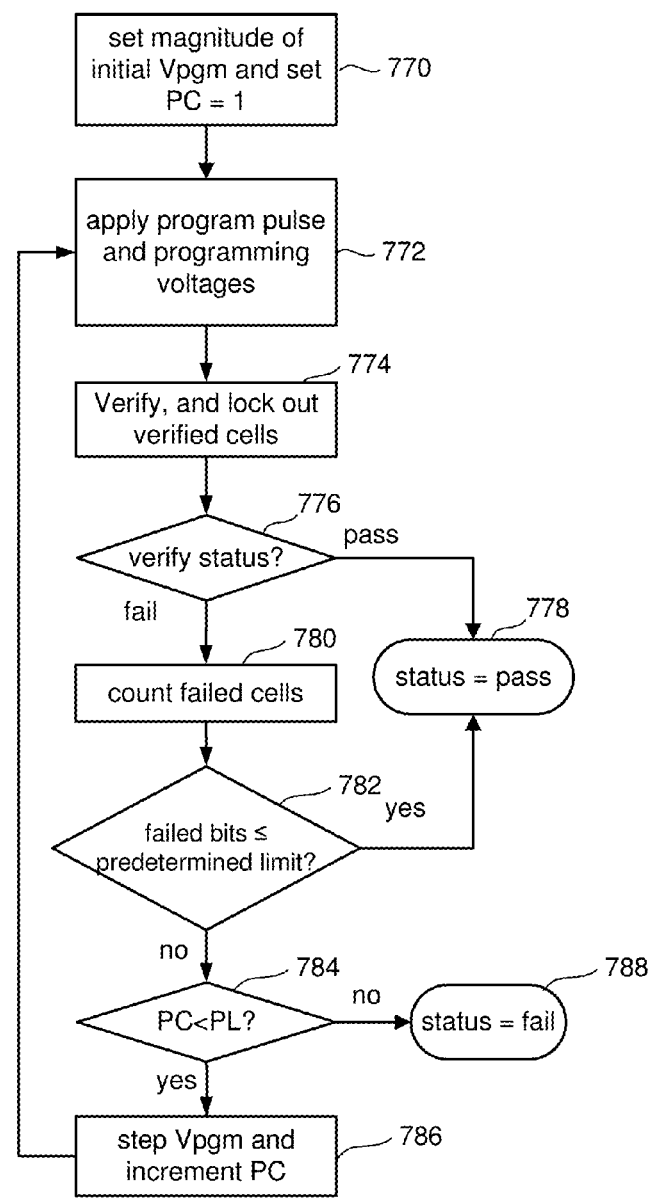
FIG. 6B is a flow chart describing one embodiment of a process for programming.

FIG. 6B is a flowchart describing one embodiment of a process for programming The process of FIG. 6B is performed by the memory die in response to the steps of FIG. 6A (ie in response to the instructions, data and addresses from Controller 122). In one example embodiment, the process of FIG. 6B is performed on memory die 108 using the one or more control circuits discussed above, at the direction of state machine 112. The process of FIG. 6B can also be used to implement the full sequence programming discussed above. Additionally, the process of can be used to implement each phase of a multi-phase programming process.

Typically, the program voltage applied to the control gates (via a selected word line) during a program operation is applied as a series of program pulses. Between programming pulses are a set of verify pulses to perform verification. In many implementations, the magnitude of the program pulses is increased with each successive pulse by a predetermined step size. In step 770 of FIG. 6B, the programming voltage (Vpgm) is initialized to the starting magnitude (e.g., ~12-16V or another suitable level) and a program counter PC maintained by state machine 112 is initialized at 1. In step 772, a program pulse of the program signal Vpgm is applied to the selected word line (the word line selected for programming) In one embodiment, the group of memory cells being programmed concurrently are all connected to the same word line (the selected word line). The unselected word lines receive one or more boosting voltages (e.g., ~7-11 volts) to perform boosting schemes known in the art. If a memory cell should be programmed, then the corresponding bit line is grounded. On the other hand, if the memory cell should remain at its current threshold voltage, then the corresponding bit line is connected to Vdd to inhibit programming In step 772, the program pulse is concurrently applied to all memory cells connected to the selected word line so that all of the memory cells connected to the selected word line are programmed concurrently. That is, they are programmed at the same time or during overlapping times (both of which are considered concurrent). In this manner all of the memory cells connected to the selected word line will concurrently have their threshold voltage change, unless they have been locked out from programming.

In step 774, the appropriate memory cells are verified using the appropriate set of verify reference voltages to perform one or more verify operations. In one embodiment, the verification process is performed by applying the testing whether the threshold voltages of the memory cells selected for programming have reached the appropriate verify reference voltage.

In step 776, it is determined whether all the memory cells have reached their target threshold voltages (pass). If so, the programming process is complete and successful because all selected memory cells were programmed and verified to their target states. A status of "PASS" is reported in step 778. If, in 776, it is determined that not all of the memory cells have reached their target threshold voltages (fail), then the programming process continues to step 780.

In step 780, the system counts the number of memory cells that have not yet reached their respective target threshold voltage distribution. That is, the system counts the number of memory cells that have, so far, failed the verify process. This counting can be done by the state machine, the Controller, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 782, it is determined whether the count from step 780 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 778. In this situation, enough memory cells programmed correctly such that the few remaining memory cells that have not been completely programmed can be corrected using ECC during the read process. In some embodiments, step 780 will count the number of failed cells for each sector, each target data state or other unit, and those counts will individually or collectively be compared to a threshold in step 782.

In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If number of failed memory cells is not less than the predetermined limit, than the programming process continues at step 784 and the program counter PC is checked against the program limit value (PL). Examples of program limit values include 20 and 30; however, other values can be used. If the program counter PC is not less than the program limit value PL, then the program process is considered to have failed and a status of FAIL is reported in step 788. If the program counter PC is less than the program limit value PL, then the process continues at step 786 during which time the Program Counter PC is incremented by 1 and the program voltage Vpgm is stepped up to the next magnitude. For example, the next pulse will have a magnitude greater than the previous pulse by a step size (e.g., a step size of 0.1-0.4 volts). After step 786, the process loops back to step 772 and another program pulse is applied to the selected word line so that another iteration (steps 772-786) of the programming process of FIG. 6B is performed.

In one embodiment, data is programmed in units of pages. So, for example, the process of FIG. 6B is used to program one page of data. Because it is possible that errors can occur when programming or reading, and errors can occur while storing data (e.g., due to electrons drifting, data retention issues or other phenomenon), error correction is used with the programming of a page of data. Many ECC coding schemes are well known in the art.

Step 774 of FIG. 6B includes performing verification. The process of verifying includes performing various sensing operations that include applying a verify compare voltage (e.g., Vv1, Vv2, Vv3, . . . ) on the selected word line to determine whether selected memory cells have a threshold voltage less than or greater than the verify compare voltage. Because the selected word line can be connected to selected memory cells and unselected memory cells, it is possible that the application of the verify compare voltage can cause unselected memory cells connected to the selected word line (thereby receiving the verify compare voltage) to a change in threshold voltage. This is called read disturb. To prevent read disturb during the verify operations, the memory system boosts the channels of unselected NAND strings by applying a boosting voltage (referred to as Vread) to unselected word lines. As a result, the channels of unselected NAND strings boost up to a positive voltage, which reduces the voltage differential between the channel and the control gates, thereby reducing the change of a read disturb.

In one embodiment, the transistors operating as select devices connected to the drain side selection lines/layers (SGD0, SGD1, SGD2 and SGD3) and the source side selection lines/layers (SGS0, SGS1, SGS2 and SGS3) have the same physical structure as the data memory cells connected to data word lines (WL0, WL1, . . . ) used for storing host data. In one implementation, these select devices will be pre-programmed to a predetermined condition for select devices so that they operate in a known manner For example, all of the select devices can be programmed to be in data state S3, and are intended to stay in data state S3 during the entire lifetime of the memory system. Other data states can be used instead of data state S3. The level of the threshold voltage of the select devices is set in advance so that the signaling used to turn on and off the select devices can be set accordingly.

The threshold voltage of the data memory cells as well as the select devices is based on quantity of electrons in the charge rapping regions (in some embodiment, floating gates or other mechanisms). Over time, electrons (or holes) can drift, causing a change in the threshold voltage of the data memory cells and/or select devices. This phenomena/property is referred to as data retention. If the threshold voltage of a select device unintentionally changes over time, it may not operate as intended. For example, a NAND string that was supposed to be unselected may get selected, or a NAND string that was supposed to be selected may get unselected. Even if the change in threshold voltage does not cause a change in selected/unselected, the change in threshold voltage of a select device could result in a change in current through the NAND string. For example, if a select device has a lower threshold voltage than planned for, the select device might conduct a different current during programming which would alter the result of the programming or reading. FIG. 5B depicts a set of threshold voltages for data memory cells connected to word line WL0 when the source side select devices (connected to the one or more of the source side selection lines) have experienced drift in threshold voltage. As can be seen from FIG. 5B, the widths of the threshold voltage distributions have widened as compared to FIG. 5, thereby, causing the threshold voltage distributions S1-S7 to overlap which can lead to potential errors reading the data for memory cells in the overlap regions. It have been observed that this problems is worse for the word lines closest to the source side selection lines, such as word lines WL0 and WL1.

To remedy the problems discussed above with respect to programming (or other memory operations) when the source side select devices (connected to the one or more of the source side selection lines) have experienced drift in threshold voltage, it is proposed to repurpose one of the word lines to be another selection line, thus operating the memory cells connected to the repurposed word line as select devices. Whatever signal is supposed to be asserted on the source side selection line will be asserted on the repurposed word line. Therefore, the repurposed word line will be dedicated for system operation and will no longer be available for storing host data; however, the memory cells connected to the other word lines will benefit. In one embodiment, the system will repurpose word line WL0 (which is an edge word line because it is located at the edge of the set of word lines). In other embodiments, other or additional word lines can be repurposed. For example, if the select devices connected to SGS0 (see FIG. 4F) have experienced drift in threshold voltage, then the memory cells connected to WL0 that are in SB0 (see FIG. 4F) are repurposed to be used as select devices. In one embodiment, the memory cells connected to WL0 that are in SB0 are repurposed to be used as select devices in addition to the select devices connected to SGS0. In another embodiment, the memory cells connected to WL0 that are in SB0 are repurposed to be used as select devices instead of the select devices connected to SGS0.

Figure 7:
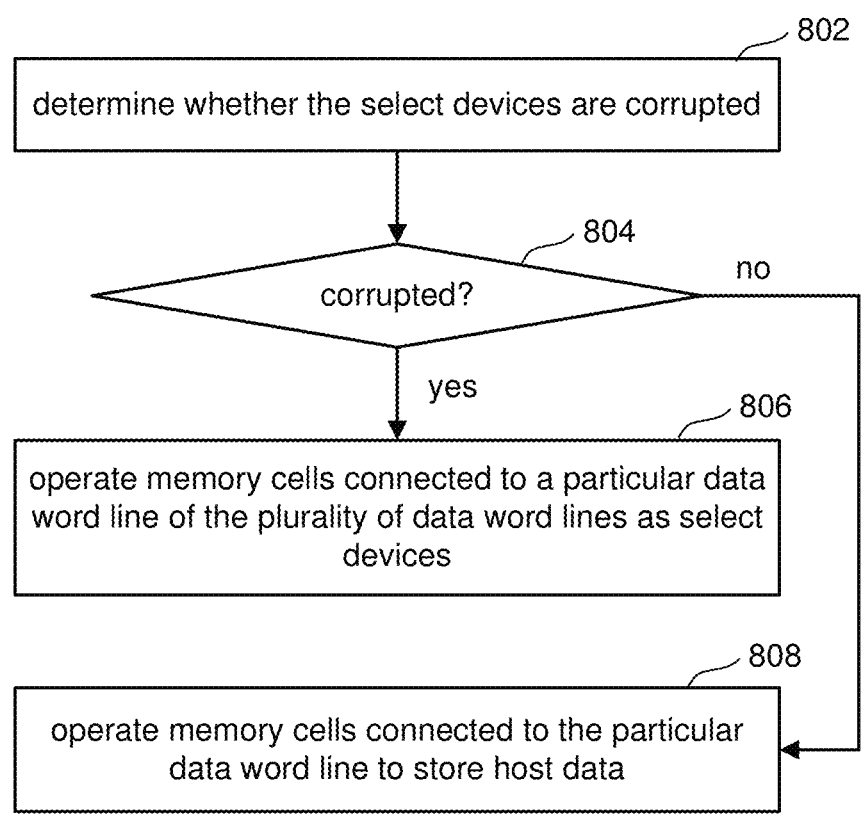
FIG. 7 is a flow chart describing one embodiment of a process for repurposing a word line to be another selection line, thus operating the memory cells connected to the repurposed word line as select devices.

FIG. 7 is a flow chart describing one embodiment of a process for repurposing a word line to be another selection line, thus operating the memory cells connected to the repurposed word line as select devices. The process of FIG. 7 is performed by any one or combination of the one or more control circuits. For example, the process of FIG. 7 can be performed by and/or at the direction of Controller 122 or state machine 112.

In step 802, the one or more control circuits determine whether the select devices are corrupted. For example, the one or more control circuits can detect the threshold voltage distributions of the select devices connected to the source side selection line and see whether the detected threshold voltage distribution matches the targeted or expected threshold voltage distribution. For example, the one or more control circuits can read or perform a sensing operation at a specific threshold voltage and count the number of memory cells that have an error. In one example where all select devices had been preset to be within a threshold distribution for data state S3, detecting whether the select devices are corrupted can include performing a sensing operation or reading operation at Vv3 (see FIG. 5). Those select devices that turn on in response to Vv3 volts being applied to the selection line have a threshold voltage that is lower than Vv3 and, therefore are not in data state S3 and are an error. Those select devices that do not turn on in response to Vv3 being applied to the selection line are assumed to not be an error. In another embodiment, the system can perform two sensing operations: one at Vv3 and the other at a level above Vv3 (e.g. Vv4), in order to look for memory cells outside the range defined by the two sensing operations. In one embodiment, the system will tolerate a small number of select devices being outside the targeted threshold voltage distribution. That is, if the number of select devices outside the expected threshold voltage distribution is above a certain number, then the one or more control circuits will assume that the threshold voltage distribution of the population of select devices has shifted sufficiently away from the target such that there is a problem that needs to be rectified. That is, the system concludes that the select devices are corrupted in step 804.

In response to determining that the select devices are corrupted (step 804), the one or more control circuits will operate memory cells connected to a particular data word line of the plurality of data word lines for the block as select devices. That is, one of the word lines has been chosen to be repurposed. In one example, data word line WL0 is repurposed to become a select line. All the memory cells connected to WL0 will be operated as select devices. Thus, WL0 is used as a replacement for SGS. In some embodiments, selection line SGS will still be used as a selection line in addition to WL0. In order to use WL0 as a replacement or additional source side select line, all the memory cells connected to WL0 are programmed to a threshold voltage distribution used for non-corrupt select devices. In the example where the select devices are supposed to be in data state S3, then the one or more control circuits will program the memory cells connected to WL0 to be in data state S3. In other embodiments, the memory cells connected to WL0 can be programmed to be equally distributed between data states S3-S7 (with no memory cell connected to WL0 being in data states S0-S2). Even after using WL0 as a selection line, the information stored in the memory cells connected to word line WL0 will continue to be used by Controller 122 with any ECC coding and decoding, or any other data error evasive measures. Memory cells that are connected to other word lines will continued to be operated in normal mode. The data word line WL0 is, therefore, dedicated to the system for the above purpose and will no longer be used for host data. Controller 122 will keep a table of blocks that have had this special repurposing of data word line WL0. Note that while it is possible to reprogram the threshold voltages for the select devices, such reprogramming is very difficult and can lead to other problems.

If it is determined, in step 804, that the select devices are not corrupted, then in step 808 the system will continue in normal programming mode such that memory cells connected to the particular data word wine that could have been repurposed but was not repurposed will still continue to be used as regular memory cells that store host data. That is, the data word line WL0 will not be repurposed and all of the memory cells connected to WL0 will continue to be available to be programmed to store host data.

FIG. 8A shows threshold voltage distribution 852, which corresponds to the expected threshold voltage distribution for non-corrupt select devices. Thus, threshold voltage distribution 852 is a predetermined condition for select devices that are not corrupted. Threshold voltage distribution 854 is an example of a threshold voltage distribution for select devices that are corrupted. As can be seen, some of the select devices associated with threshold voltage distribution 854 have had their threshold voltage lowered due to data retention issues, such as drifting of electrons. The widening and lowering of the lower bounds of the threshold voltage distribution (from 852 to 854) can lead to changes in behavior during the programming process that will ultimately lead to errors when reading back data. Thus, in one embodiment, step 802 of FIG. 7 seeks to determine whether the select devices have a threshold voltage distribution like distribution 852 or like distribution 854. If the reading process of the select devices indicates a threshold voltage distribution similar to that of distribution 852 of FIG. 8A, then the one or more control circuits conclude that the select devices are not corrupted. If the results or the reading process determine that the threshold voltage distribution of the sensed select devices are closer to distribution 854, then the one or more control circuits will conclude that the select devices are corrupted (even if a small subset of select devices have not been affected by the data retentions issues).

Step 806 of FIG. 7 includes operating the memory cells connected to WL0 (or other data Word Line) as select devices. In one embodiment, this includes programming those memory cells to be threshold voltage distribution 856 of FIG. 8B which corresponds to the target distribution 852 of FIG. 8A (and data state S3). Once the memory cells are in threshold voltage distribution 856, then they should respond to the signals intended for a selection line in the same way that a select device would.

Looking back at FIG. 4F, it has been discussed that in one embodiment the blocks of memory cells are divided into sub-blocks. Additionally, the selection lines are divided by sub-block. For example on the source side selection line SGS0 corresponds to one sub-block, SGS1 corresponds to another sub-block, SGS2 corresponds to another sub-block, and SGS3 corresponds to a fourth sub-block. In one embodiment the process of FIG. 7 is performed separately on each of the sub-blocks. Therefore, the one or more control circuits can conclude that SGS2 is corrupted while the other source side select lines are not corrupted. In that case, only memory cells connected to WL0 that are part of the sub-block associated with SGS2 will be operated as select devices. On the other hand, if SGS1 and SGS3 are determined to be corrupted, then the memory cells connected to WL0 that are on those sub-blocks corresponding to SGS1 and SGS3 will be operated as select devices while the other memory cells connected to WL0 will be operated as regular data memory cells suitable for storing host data.

In one embodiment, SGS drift detection management module 234 of FIG. 3 is used to perform and/or manage the process for repurposing the word lines as per the process of FIG. 7 in embodiments when Controller 122 is performing the process of FIG. 7. Word line back pattern generation module 236 is used to generate the pattern that is programmed into the memory cells that are being repurposed to be used as select devices. While one embodiment the back pattern generated would be "000" corresponding to state S3, other patterns can also be used.

Figure 9:
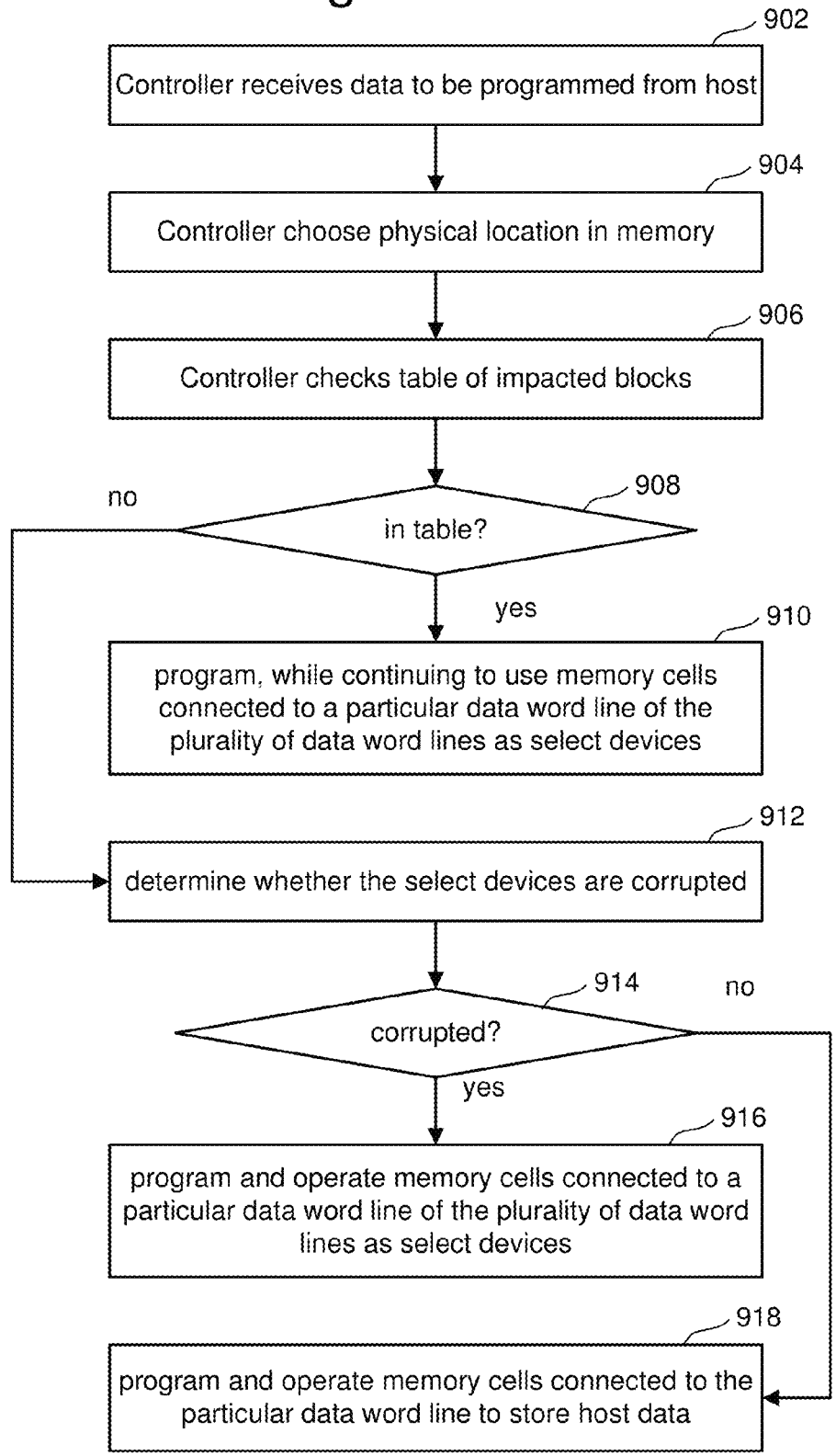
FIG. 9 is a flow chart describing one embodiment of a process for repurposing a word line to be another selection line, thus operating the memory cells connected to the repurposed word line as select devices.

FIG. 9 is a flowchart describing one embodiment of a process of repurposing a word line to be another selection line, thus operating the memory cells connected to the repurposed word line as select devices. The process of FIG. 9 is an example implementation of the process of FIG. 7. The process of FIG. 9 is performed by any one or combination of the one or more control circuits. For example, the process of FIG. 9 can be performed by and/or the direction of Controller 122. In such an embodiment, SGS drift detection management module 234 of Controller 122 can be used to perform the Controller's duties in the process of FIG. 9, with WL back pattern generation module 236 providing the pattern that is programmed into the memory cells as being repurposed. However, in other embodiments, other portions or components of Controller 122 (or another processor) can be used to perform the process of FIG. 9.

In step 902 of FIG. 9, Controller 122 receives data from host 140. That data is to be programmed into the memory. In step 904, Controller 122 chooses a physical location in the memory to store the data. In some embodiments, the host will chose the physical location. As discussed above, Controller 122 maintains a table of all blocks (impacted blocks) that have had their edge word line WL0 repurposed to be an additional or replacement selection line. Therefore, in step 906, Controller 122 determine whether the block associated with the physical location chosen in 904 is in the table of impacted blocks. If the block associated with the physical location chosen in step 904 is in the table of impacted blocks, then in step 910 the one or more control circuits will program the data received from the host into the chosen physical location while continuing to use the memory cells as select devices for those memory cells connected to the particular word line that was repurposed (e.g. WL0). If (step 908) it was determined that the block associated with the physical location chosen in step 904 was not in the table of impacted blocks, that in step 912, Controller 122 determines whether the select devices for the block associated with the physical location chosen in step 904 are corrupted. If the select devices are corrupted (step 914), then in step 916, one or more control circuits will program the data received from the host into the chosen physical locations while operating memory cells connected to a particular word line as select devices. Step 916 is analogous to step 806 of FIG. 7. The programming is performed by the Controller 122 instructing the memory die to program, and the memory dies (at the direction of state machine 112) performing the programming If the select devices are determined not to be corrupted (step 914), then in step 918, the one or more control circuits will program the data received from the host into the chosen physical location while operating the memory cells connected to the particular word line as regular data memory cells used to store host data.

FIG. 10A is a flowchart describing one embodiment of a process for determining whether select devices are corrupted. That is, the process of FIG. 10A is one example implementation of step 912 of FIG. 9. The process of FIG. 10A could also be used to implement step 802 of FIG. 7. In step 1002 of FIG. 9, Controller 122 sends a command to the memory die 108 to read the threshold voltage distribution of one of the source side select lines. One embodiment can include reading the exact threshold voltage of each memory cell to create a representative set of data that provides the exact metes and bounds of the threshold voltage distribution of the select devices connected to the particular source side select line (e.g., SGS0, SGS1, SGS2 or SGS3). In another embodiment, the memory system can sense whether each of the select devices have at least a particular threshold voltage. In another embodiment, a read process can be performed for a verify compare level and the system will determine how many of the select devices have a read error (do not have a threshold voltage at least as high as the verified compare level). In response to the command sent by Controller 122, in step 904 the memory die will read the information from the particular addressed source side select line. The results of that read process are sent back to the Controller 122 in step 1006. In step 1008, Controller 122 determines the number of select devices that are not in the predetermined condition using the data received in step 1006. For example, Controller 122 may determine how many select devices have a threshold voltage outside of data state S3 or do not have a threshold voltage that is above Vv3, etc. Each of those select devices that are not in the predetermined condition are considered an error. In step 1010, Controller 122 determines whether the number of errors is above some predetermined limit. In one embodiment, the system will not repurpose a word line unless a minimum number of errors are found. The "limit" in step 1010 can include a number that is significantly less than the maximum number of errors that can be corrected by ECC (error correction codes). If the number of errors are not greater than the limit, then in step 1012 Controller 122 concludes that the threshold voltage distribution did not sufficiently shift; therefore, the select devices are not concluded to be corrupted in step 1012. If the number of errors is greater than the limit (step 1010), then in step 1014 Controller 122 concludes that the threshold voltage did sufficiently shift; therefore, it is concluded that the select devices are corrupted.

FIG. 10B is a flowchart describing one embodiment of a process for programming and operating memory cells connected to a data word line as select devices. That is, the process of FIG. 10B is one example implementation of step 916 of FIG. 9. The process of FIG. 10B could also be used to implement step 806 of FIG. 7. In step 1040 FIG. 10B, Controller 122 commands memory die 108 to program data word line WL0 to a predetermined condition for select devices that are not corrupted. For example, the memory cells can be programmed to threshold voltage distribution 856 of FIG. 8B. In step 1042, memory die 108 will program the memory cells connected to WL0 to the predetermined condition (threshold voltage distribution 956 of FIG. 8B). In one embodiment, only those memory cells connected to WL0 that are in the sub-block associated with source side select lines that are corrupted will be programmed to step 1042. In step 1044, Controller 122 updates the table of impacted blocks (see step 906) to indicate that the block that contains a repurposed WL0. In step 1046, Controller 122 instructs memory die 108 to program host data into any of (or all of) the data word lines (e.g. WL1-WLX, where for example WLX can be WL47) other than WL0. The programming in step 1046 includes operating WL0 as a source side select line and the memory cells connected to WL0 (that are in the appropriate sub-blocks) at source side select devices. Therefore, whatever signal is applied to the source side select line of the chosen sub-block for programming, WL0 will receive the exact same signal. For example, if the select devices of SGS2 were found to be corrupt and the system is programming data into the sub-block SB2 associated with SGS2, then whatever signal is applied to SGS2 is also applied to WL0. This way, the memory cells connected to WL0 in the sub-block SB2 will be operated as select devices rather than data memory cells. In step 1048, the memory die will perform the programming as per the instructions of step 1046, such that host data is programmed into the memory cells connected to any one of the data word lines WL1-WLX, operating the memory cells in the appropriate sub-block connected to WL0 as source side select devices in operating WL0 as a source side selection line.

FIG. 10C is a flowchart describing one embodiment of a process for programming and operating memory cells connected to the potentially repurposed data line as regular data memory cells that store and host data. The process of FIG. 10C is one example implementation of step 918 of FIG. 9. The process of FIG. 10C can also be used to implement step 808 of FIG. 7. In step 1060 of FIG. 10C, Controller 122 instructs the memory die 108 to program host data into any one of WL0-WLX, operating WL0 as a data word line and the memory cells connected to WL0 as data memory cells that can potentially store data received from the host. In step 1062, memory die 108 programs the data into any one of the data word lines WL0-W1X, as instructed by Controller 122 in step 1060.

Figure 10D:
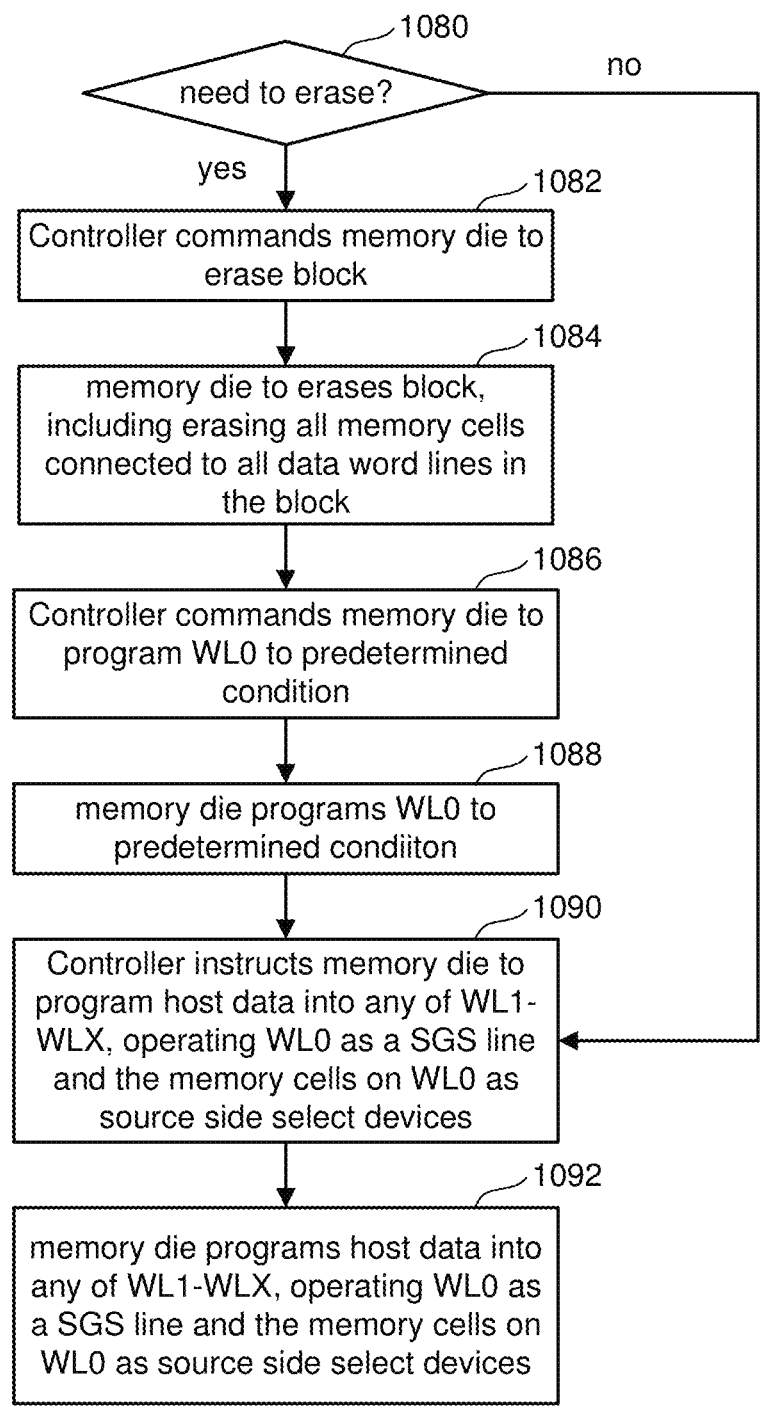
FIG. 10D is a flow chart describing one embodiment of a process for programming host data while continuing to use memory cells connected to a particular data word line in the plurality of data word lines as select devices.

FIG. 10D is a flowchart describing one embodiment of a process for programming host data while continuing to use memory cells connected to a particular data word line in the plurality of data word lines as select devices. The process of FIG. 10D is one example implementation of step 910 of FIG. 9.

In one embodiment, when programming data into a fresh block of memory cells, the block will first be erased. After erasing all the memory cells, then programming will begin. The combination of programming and erasing is referred to as a program-erase cycle. In some memory systems, when data is erased, rather than actually erasing the data, the block is marked to be erased next time data needs to be programmed into the memory system. The reception of new data to be programmed will start the next program-erase cycle. As discussed above, some embodiments contemplate that select devices are not erased or reprogrammed during the life of the memory system. However, the repurposed memory cells will be erased when a block of memory cells is erased. Therefore, at each new program-erase cycle, when all the memory cells are erased, those memory cells that have been repurposed because they are connected to a word line that has been repurposed as a selection line have to be reconditioned so that they will operate as select devices. This concept is provided for in the process of FIG. 10D.

In step 1080, Controller 122 determines whether the block for which it is about to program data into needs to be erased; for example, if the block has stale data, old data or data that has been marked to be erased. If not, the process continues at 1090. If the block does need to be erased, then the process continues at step 1082.

In step 1082, Controller 122 commands the memory die to erase the block that is targeted for programming In step 1084, memory die 108 erases the block in response to the command of the Controller. The erasing includes erasing all memory cells connected to all data word lines in the block. Thus, any data word line that has been repurposed as a selection line will still have the memory cells connected to that word line be erased. In step 1086, Controller 122 commands the memory die to program memory cells connected to WL0 (or other data word line that has been repurposed) to the predetermined condition for select devices. For example, Controller 122 will command the memory die to program WL0 to data state S3. In step 1088, the memory die programs memory cells connected to WL0 to the predetermined condition. When only certain sub-blocks of WL0 have been repurposed, only those memory cells in the sub-blocks that have been repurposed will be programmed in step 1088. As a result of steps 1082-1088, memory cells that have been programmed to be in the predetermined condition to act as select devices are subsequently erased and then subsequently reprogrammed to the predetermined condition for select devices.

In step 1090, Controller 122 instructs memory die 108 to program host data into any one or more of WL1-WLX, operating WL0 as a source side select line for the relevant sub-blocks and the memory cells that are connected to WL0 as source side select devices (for the relevant sub-blocks). In step 1092, the memory die programs the host data into any one or more of WL1-WLX, operating WL0 as a source side select line and the memory cells connected to WL0 as source side select devices.

As a result of the above-described technology, blocks of memory cells with corrupted select devices may still be used for host data.

One embodiment includes a non-volatile storage apparatus, comprising: a plurality of non-volatile data memory cells arranged into groups of data memory cells; a plurality of select devices connected to the groups of data memory cells; a selection line connected to the select devices; a plurality of data word lines connected to the data memory cells; and one or more control circuits connected to the selection line and the data word lines. The one or more control circuits are configured to determine whether the select devices are corrupted. The one or more control circuits are configured to operate memory cells connected to a particular data word line of the plurality of data word lines as select devices if the select devices are corrupted.

One embodiment includes as apparatus, comprising: one or more processors adapted to be in communication with a non-volatile memory. The one or more processor are configured to issue one or more commands to the memory to obtain threshold voltage distribution information for a set of select devices connected to a selection line in the memory. The one or more processors are configured to determine whether a threshold voltage distribution for the select devices has shifted. The one or more processors are configured to program memory cells on a data word line in the memory to put the memory cells in a predetermined condition for the select devices and operate the data word line as the selection line if the threshold voltage distribution for select devices has shifted.

One embodiment includes a method of operating non-volatile storage, comprising: sensing select devices connected to a selection line to determine whether the select devices are in a condition; and operating non-volatile memory cells connected to a data word line as select devices and operating the data word line as the selection line if at least a minimum number of select devices are sensed to not be in the condition.

One embodiment includes a non-volatile storage apparatus, comprising: a monolithic three dimensional memory structure comprising data word lines, bit lines and NAND strings, the NAND strings includes memory cells and select devices; means for determining whether the select devices are corrupted; and means for operating memory cells connected to a data word line as select devices if the select devices are corrupted.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile storage apparatus, comprising:
   a plurality of non-volatile data memory cells arranged into groups of data memory cells;
   a plurality of select devices connected to the groups of data memory cells;
   a selection line connected to the select devices;
   a plurality of data word lines connected to the data memory cells; and
   one or more control circuits connected to the selection line and the data word lines, the one or more control circuits are configured to determine whether the select devices are corrupted, the one or more control circuits are configured to operate memory cells connected to a particular data word line of the plurality of data word lines as select devices if the select devices are corrupted.

2. A non-volatile storage apparatus according to claim 1, wherein:
   the one or more control circuits are configured to determine whether the select devices are corrupted by sensing whether the select devices have at least a particular threshold voltage.

3. A non-volatile storage apparatus according to claim 1, wherein:
   the one or more control circuits are configured to determine whether the select devices are corrupted by reading the select devices for a given threshold voltage and determining how many of the select devices have a read error.

4. A non-volatile storage apparatus according to claim 1, wherein:
   the groups of data memory cells are vertical NAND strings;
   the selection line is a source side selection line for the vertical NAND strings; and
   the particular data word line is an edge word line.

5. A non-volatile storage apparatus according to claim 1, wherein:
   the one or more control circuits are configured to program the memory cells connected to the particular data word line to put the memory cells connected to the particular data word line in a predetermined condition for the select devices that are not corrupted.

6. A non-volatile storage apparatus according to claim 5, wherein:
   the one or more control circuits are configured to program the memory cells to a set of data states;
   the predetermined condition for the select devices is a particular data state of the set of data states; and
   the select devices are corrupted if more than a minimum number of the select devices are not in the particular data state.

7. A non-volatile storage apparatus according to claim 5, wherein:
   the one or more control circuits are configured to program the memory cells to a set of data states;
   after programming the memory cells connected to the particular data word line to put the memory cells connected to the particular data word line in the predetermined condition, the one or more control circuits are configured to erase the plurality of memory cells including the memory cells connected to the particular data word line; and
   after erasing the plurality of memory cells, the one or more control circuits are configured to re-program the memory cells connected to the particular data word line to put the memory cells connected to the particular data word line in the predetermined condition for the select devices.

8. A non-volatile storage apparatus according to claim 1, wherein:
   the one or more control circuits are configured to operate the data word line as the selection line if the select devices are corrupted.

9. A non-volatile storage apparatus according to claim 1, wherein:
   the plurality of non-volatile data memory cells are arranged in a monolithic three dimensional memory structure.

10. A non-volatile storage apparatus according to claim 1, wherein:
- the particular data word line is connected to all of the groups of memory cells for a block;
- the selection line is connected to a subset of the groups of memory cells for the block;
- the one or more control circuits are configured to operate memory cells connected to the particular data word line and that are in the subset of groups as select devices if the select devices are corrupted; and
- the one or more control circuits are configured to operate memory cells connected to the particular data word line and that are not in the subset of groups as data memory cells even if the select devices are corrupted.

11. A non-volatile storage apparatus, comprising:
- a monolithic three dimensional memory structure comprising data word lines, bit lines and NAND strings, the NAND strings includes memory cells and select devices;
- means for determining whether the select devices are corrupted; and
- means for operating memory cells connected to a data word line as select devices if the select devices are corrupted.

12. A non-volatile storage apparatus according to claim 11, further comprising:
- means for programming the memory cells connected to the data word line to a predetermined condition for uncorrupted select devices.

* * * * *